United States Patent [19]
Toshima

[11] Patent Number: 6,007,675
[45] Date of Patent: Dec. 28, 1999

[54] WAFER TRANSFER SYSTEM AND METHOD OF USING THE SAME

[75] Inventor: Masato Toshima, Sunnyvale, Calif.

[73] Assignee: Gamma Precision Technology, Inc., Santa Clara, Calif.

[21] Appl. No.: 08/982,275

[22] Filed: Dec. 1, 1997

Related U.S. Application Data

[63] Continuation-in-part of application No. 08/889,172, Jul. 8, 1997, Pat. No. 5,944,940, which is a continuation-in-part of application No. 08/677,136, Jul. 9, 1996, Pat. No. 5,900,105.

[51] Int. Cl.$^6$ .................................................. C23C 16/00
[52] U.S. Cl. .................. 156/345; 118/723 E; 118/723 I; 118/716; 118/730; 204/298.25; 204/298.35; 134/48; 134/50; 134/52; 134/61; 134/63; 134/902; 414/217; 414/219; 414/220; 414/936; 414/937; 414/938; 414/939; 414/940; 438/716
[58] Field of Search .............................. 438/716; 134/48, 134/50, 52, 56 R, 61, 63, 134, 84, 902; 118/719, 723 E, 723 I, 730; 204/298.25, 298.35; 414/217, 219, 220, 936, 937, 938, 939, 940, 930; 156/345 C, 345 PC, 345 PH, 345 WH, 345 MC, 345

[56] References Cited

U.S. PATENT DOCUMENTS

| | | | |
|---|---|---|---|
| 5,084,125 | 1/1992 | Aoi | 156/345 |
| 5,292,393 | 3/1994 | Maydan et al. | 156/345 |
| 5,820,679 | 10/1998 | Yokoyama et al. | 118/719 |
| 5,855,681 | 1/1999 | Maydan et al. | 118/719 |
| 5,855,726 | 1/1999 | Soraaka et al. | 156/345 |

*Primary Examiner*—Bernard Codd
*Attorney, Agent, or Firm*—Lyon & Lyon LLP

[57] ABSTRACT

An apparatus and method are described for stripping the photoresist from a wafer while in a substantially parallel manner, another wafer is being transferred between a load lock chamber and a transfer chamber, where the processing occurs. Further, a system is described whereby two load lock chambers are employed so that processing of wafers can continue uninterrupted by a delay caused by the need to open, empty, reload and re-equilibrate a single load lock chamber. Still further, a system is described for performing multi-step dry-stripping applications requiring different conditions for two or more of the steps wherein the steps may be performed simultaneously or sequentially. Finally, a system combining a dry-stripping module and a wet-cleaning module is described which combination system permits the continuous, fully-automated dry-stripping and wet-cleaning of wafers and, upon completion of the entire processing cycle, returning wafers to their original wafer cassettes.

17 Claims, 16 Drawing Sheets

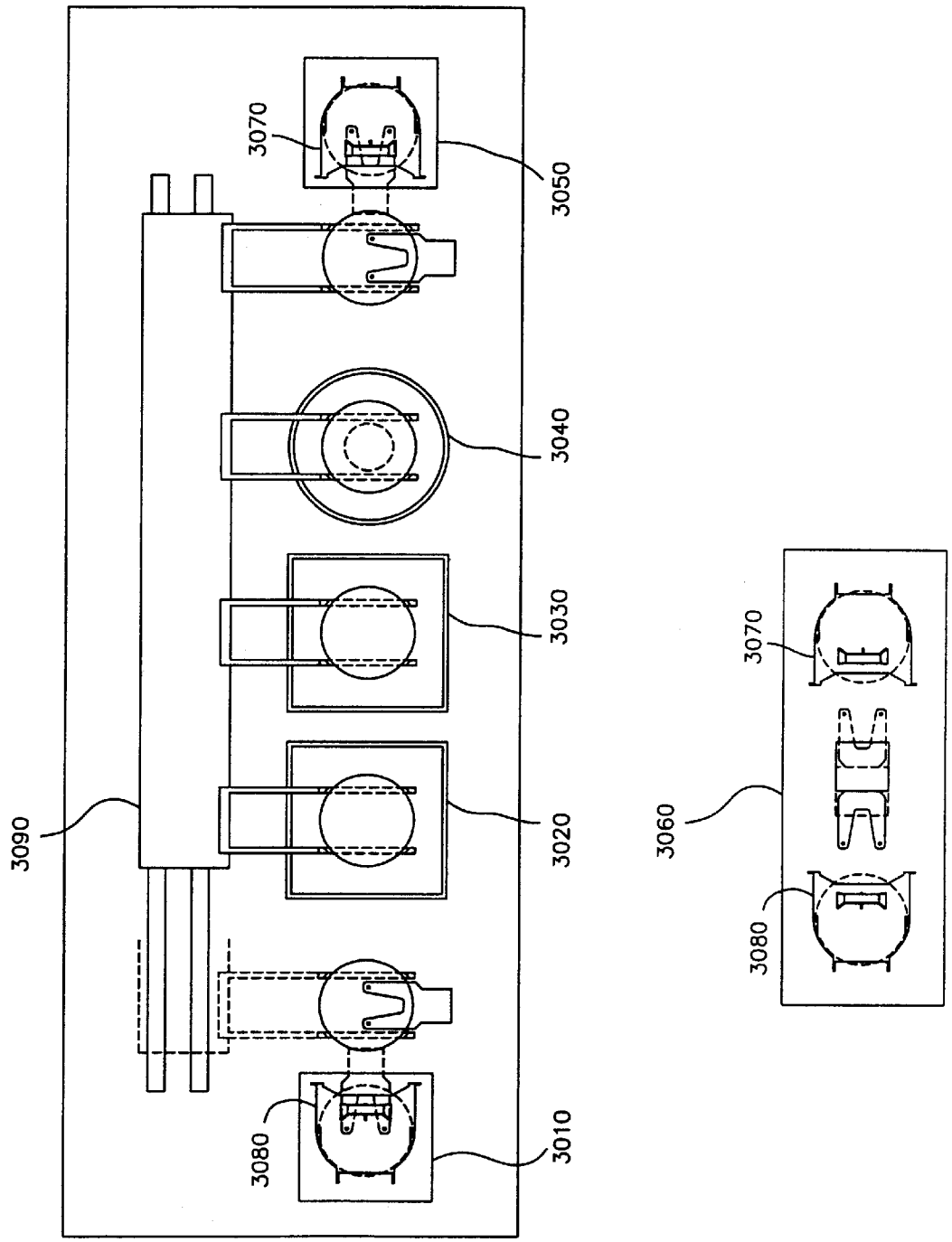

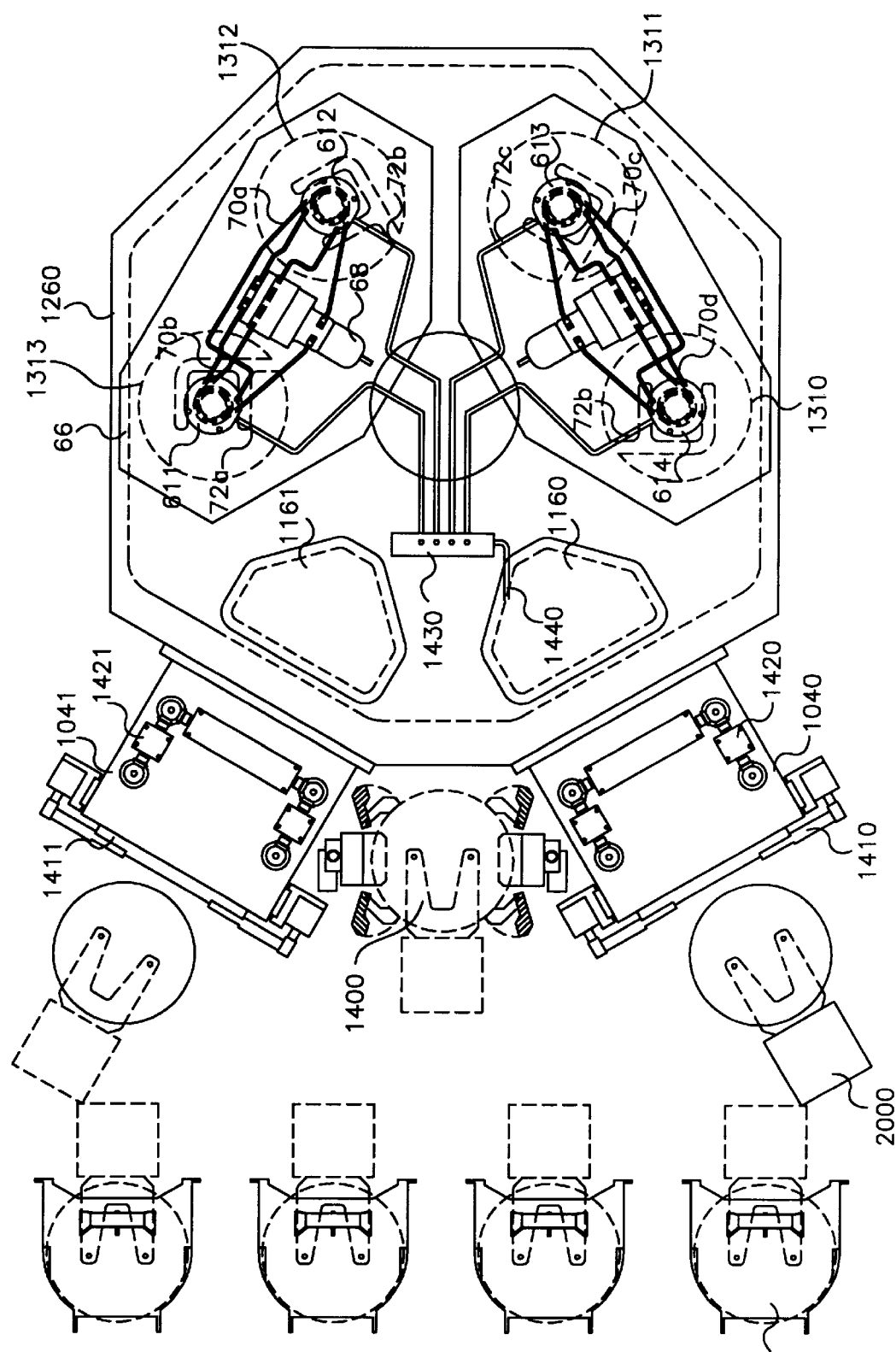

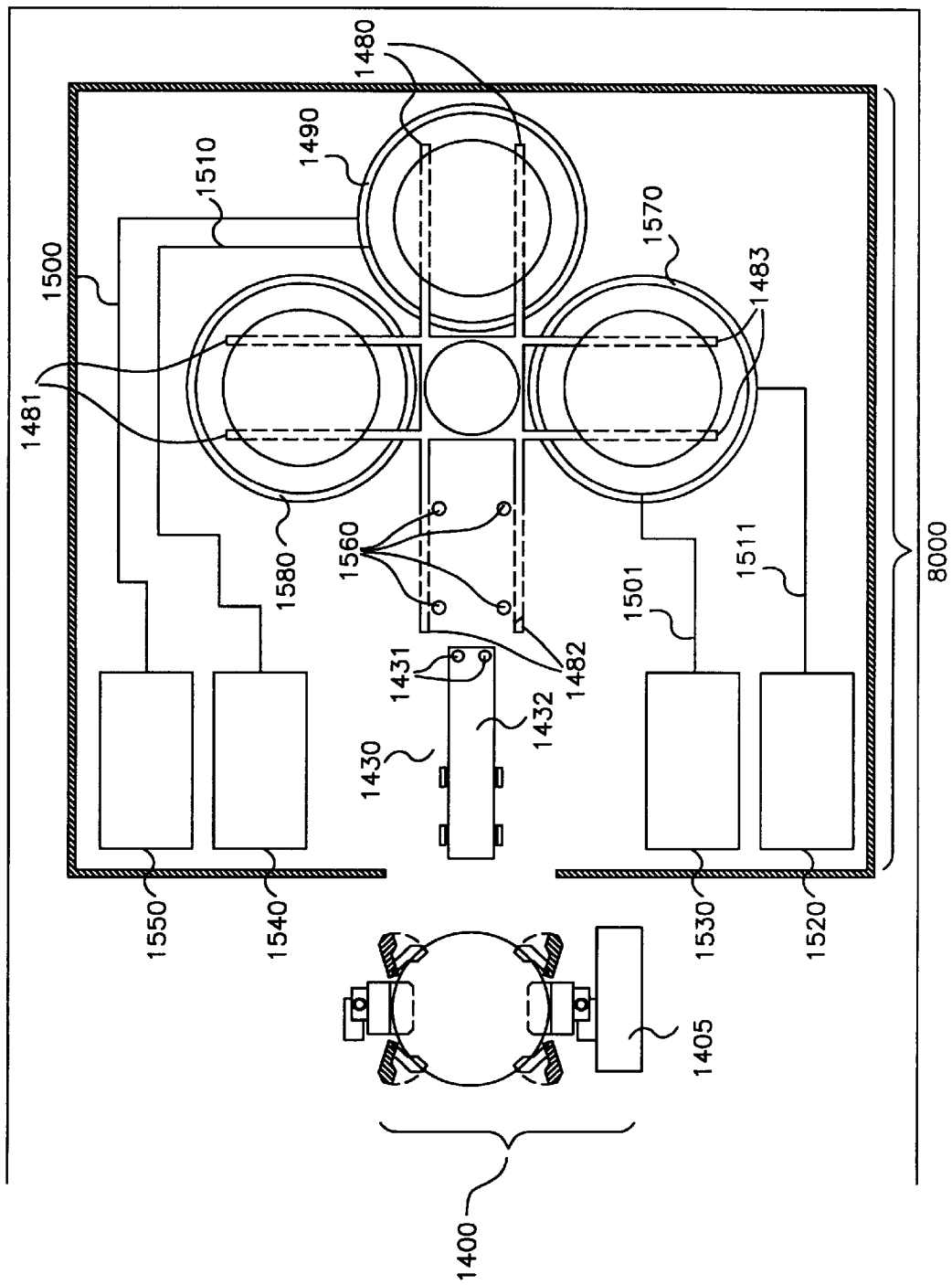

WAFER TRANSFER SYSTEM AND METHOD OF USING THE SAME

RELATED APPLICATIONS

This application is a continuation-in-part of U.S. application Ser. No. 08/889,172, filed Jul. 8, 1997 now U.S. Pat. No. 5,944,940, entitled "A Wafer Transfer System And Method Of Using Same", which is a continuation-in-part of U.S. application Ser. No. 08/677,136, filed Jul. 9, 1996, now U.S. Pat. No. 5,900,105, entitled "A Wafer Transfer System And Method Of Using Same", both of which prior applications are incorporated by reference as if fully set forth herein.

FIELD OF THE INVENTION

This invention pertains generally to the field of semiconductor manufacturing including an apparatus and method for dry-stripping photoresist from a wafer in a transfer chamber while at substantially the same time another wafer is being transferred between a load lock chamber and the transfer chamber and, particularly, to a combination system for dry-stripping photoresist from a wafer and wet-cleaning residues left after dry-stripping from the wafer.

DESCRIPTION OF RELATED ART

During the process of semiconductor fabrication, photoresist, a light sensitive film, is often deposited on a wafer surface and then "exposed" using high intensity light through a mask. The exposed photoresist is then dissolved off the wafer with developers. The pattern of photoresist remaining after development will prevent subsequent etch or implant operations in some areas while allowing etching or implant in other areas. Once the etch or implant operation is completed, the remaining photoresist is removed or stripped from the wafer surface. One method for removing the remaining photoresist is referred to as "dry-stripping."

A prior art system for removing photoresist 100 from a wafer by dry-stripping is illustrated in FIG. 1A. The prior art system comprises a load lock chamber 125 and a transfer chamber 105. A complicated robot 130 with one platen 135, a first cassette stage 140 for holding wafers and a second cassette stage 150 are disposed within the load lock chamber 125. The transfer chamber 105 includes six fins (110a–110f) mounted to a common center 120 on one end of each fin. The other end of each of the fins (110a–110f) is attached to a processing stage (115a–115f) which is coupled to each fin. There are six processing stages (115a–115f) in the transfer chamber 105.

Under the prior art system 100, the tact time was defined as the sum of the process time (typically about 15 seconds) plus loading time (typically about twenty-seven seconds) for a total of forty-two seconds. The process time is defined as the time that a wafer spends at each stage (e.g., 115a) in the transfer chamber 105 and the loading time is defined as the amount of time spent transferring a new (meaning "unprocessed" by system 100) or processed wafer between the load lock chamber 125 and the transfer chamber 105. Under the prior art system, when a wafer was being processed, another wafer could not be loaded. The converse was also true; when a wafer was being loaded, another wafer could not be processed. Thus, the wafer processing time and the wafer loading time were two separate events in the prior art system 100.

A typical loading sequence would comprise the following actions. With the load lock chamber 125 at atmospheric pressure, cassettes containing unprocessed wafers would be manually placed onto cassette stages 140 and 150. The load lock chamber 125 would then be sealed and the pressure reduced to the same pressure as that maintained in transfer chamber 105. Fin 110a would move up while the robot 130 would move with its platen 135 toward the fin 110a. The fin 110a would move down and transfer the processed wafer on to the platen 135 of the robot 130. The robot 130 would then retract and rotate toward a first cassette stage 140 or a second cassette stage 150. Assuming that the robot rotated toward first cassette stage 140, the robot 130 would then extend its platen 135 toward first cassette stage 140. The robot 130 would index and transfer the processed wafer back into the first cassette stage 140. After doing this, the robot 130 would retract and then index forward to the next wafer slot on the first cassette stage 140. The robot 130 would extend its platen 135 toward the first cassette stage 140. The robot 130 would index so that a new wafer is transferred onto the robot's platen 135. The robot 130 would then retract and rotate toward fin 110a. The robot 130 would then extend the platen 135 toward the fin 110a. The fin 110a would move up to receive the new wafer. The robot 130 would retract after the wafer was transferred to the fin 110a. The fin 110a would then rotate towards processing stage 115b and then move down so that fin 110a is now located where fin 110b was is located. In other words, all six fins (110a–110f) have moved in a counterclockwise direction since all six fins (110a–110f) are attached to a common center 120. Thus, fin 110a will then move down so that the wafer is now on processing stage 115b. The entire sequence of events typically takes about 27 seconds to load a new wafer into the transfer chamber and unload a processed wafer from the transfer chamber to the load lock chamber and then back into a cassette stage (140 or 150). Meanwhile, all processing stops during this transfer sequence.

Once a new wafer is introduced into the transfer chamber 105, processing of the wafer begins. The processing time usually takes about 15 seconds. While a wafer is being processed in the transfer chamber 105, the robot 130 is inactive and no wafers are being loaded or unloaded between the load lock chamber 125 and the transfer chamber 105.

When a second wafer is introduced into the transfer chamber 105, the first wafer which was on processing stage 115 will be moved to processing stage 115c so that the new wafer may be placed on processing stage 115b. However, during the loading and unloading sequence, the processing of the wafers inside the transfer chamber 105 must cease. Thus, throughput is greatly reduced because the wafers cannot be processed in parallel with the wafers being loaded and unloaded between the load lock chamber 125 and the transfer chamber 105.

One solution that was tried was a robot with two blades or platens spaced 180 degrees apart is placed in the load lock chamber. One of the blades picks up a new wafer from a cassette stage while a second blade removes a processed wafer from the transfer chamber and places the wafer back in the cassette stage. This solution was an improvement over the prior art system 100 described in FIG. 1, but it still did not solve the problem of processing wafers apart from the transferring of wafers between the load lock chamber 5 and the transfer chamber.

It was a common belief that if one sacrificed one of the process stages in the transfer chamber to act solely as a loading and unloading station, then a loss in throughput would occur. Therefore, all the previous solutions continued to utilize all six wafer stages as processing stages and to separate the processing of wafers from the transferring of wafers into two events. It was also believed that if one introduced a complicated mechanism inside a process environment, it would create a contamination problem for the wafers. Thus, most of the complicated robotic mechanisms used were in the load lock chamber and not in the transfer chamber where the processing occurred.

What is needed, then, with regard to the dry-stripping process is a wafer transfer mechanism that will allow the wafer loading time to substantially parallel the wafer processing time in order to increase throughput at a reduced cost while minimizing contamination of the process environment.

Dry stripping alone, however, is normally not the only post-etching or post-implantation process that a wafer undergoes. During the etching or implanting process which precedes photoresist removal, a residue may form on the sidewalls of the photoresist as the result of the sputtering of wafer surface materials, such as aluminum, tungsten and silicon caused by the heavy bombardment of the wafer surface which occurs during the etching or implant operation. These materials are generally not removed by the above-described dry-stripping process. To remove the sputtered residues, subsequent to the removal of the photoresist by dry-stripping, the wafers are subjected to "wet-cleaning."

A known wet-cleaning apparatus is shown schematically in FIG. 1B. The apparatus consists of a wafer cassette loading stage 3010, a chemical cleaning stage 3020, a water rinsing stage 3030, a wafer drying stage 3040 and a wafer unloading stage 3050. Cassettes containing wafers from the dry-stripping operation are placed on the wafer cassette loading stage. The wafer is then picked up by a wafer transfer robot 3090 and transferred to the chemical cleaning stage 3020. There, the wafer is subjected to one or more chemical cleaning agents such as hydrochloric acid, hydrofluoric acid, sulfuric acid, phosphoric acid, ammonium hydroxide and/or hydrogen peroxide. The chemical cleaning agents may be used as sole treatments, in combination or sequentially. When used sequentially, there is usually a brief water wash between applications of chemical cleaning agents. After chemical cleaning, the wafer is transferred to the water washing stage 3030 for a thorough rinsing of all chemical cleaning agents and residues from the wafer. The wafer is then transferred to a drying stage 3040 where it is dried, typically by spin-drying. When drying is complete, the wafer is transferred to the wafer unloading stage 3050 where it is placed on an exit cassette 3070.

Most wet cleaning machines are linear in configuration. Thus, while wafers come to the wafer loading stage 3010 in a wafer cassette, 3080, for example, as they exit at the wafer unloading stage 3050, they are not returned to the original wafer cassette 3080; that is, the exit cassette 3070 is not the original cassette 3080 in which the wafers arrived at the wet wash apparatus. Since it is often preferred among semiconductor wafer manufacturers to maintain the integrity of a batch of wafers and their original cassette for tracking and quality assurance purposes. In known systems of wafer processing, this requires another step. A wafer exchanger 3060, also illustrated in FIG. 1B moves the processed wafers from the exit cassette 3070 back into their original wafer cassette 3080.

The known process and equipment therefore requires three separate pieces of equipment, a dry-stripping apparatus, a separate wet cleaning apparatus often located at some distance from the dry stripping apparatus, and a wafer exchanger apparatus.

Thus, in addition to the parallel loading/processing need discussed above, what is needed is a combination system which is compact, completely automated and is capable of essentially simultaneously dry-stripping, transferring and wet washing wafers in a manner such that, when the entire process is complete, the wafers are returned to the original cassette they came in. The savings in time and space by eliminating one entire step, wafer exchange, and combining the others in a single automated system would result in a much more efficient, cost-effective production of semiconductor wafers. The invention disclosed herein provides such a system.

SUMMARY

The present invention features an apparatus and method for processing a wafer in a transfer chamber, while at substantially the same time, another wafer is being transferred between a single load lock chamber and the transfer chamber.

The present invention also features an apparatus and method for processing a wafer in a transfer chamber with two load lock chambers. In this configuration, while wafers from the first load lock chamber are being processed in the transfer chamber, a second batch of wafers can be loaded into the second load lock chamber and the environment in the second load lock chamber can be equilibrated with that in the transfer chamber. When the wafers from the first load lock chamber are through processing, the wafers in the second load lock chamber are ready to immediately being processing. Similarly, while the wafers in the second load lock chamber are being processed, the first load lock chamber can be emptied of processed wafers, reloaded with unprocessed wafers and prepared for opening to the transfer chamber. Thus, the transfer chamber need never be idle while processed wafers are unloaded from a load lock chamber, the load lock chamber is reloaded with unprocessed wafers and the environment in the load lock chamber is equilibrated to that in the transfer chamber so that the load lock chamber can be opened to the transfer chamber and processing can begin.

A third feature of the present invention is that processed wafers from the first and second load lock chamber can, after dry-stripping, be automatically transported to a wet-cleaning apparatus where they are wet-cleaned with chemical agents, water rinsed, and dried. The dry, completely processed wafers can then be automatically returned to their original wafer cassette. The combination in a single system of a dry-stripping module (the transfer chamber) and a wet-cleaning module (the wet cleaning chamber) not only saves space, it eliminates entirely a step and the associated apparatus for carrying out that step; namely, wafer exchange and the wafer exchanger used to transfer the wafers from the exit cassette of a linear wet-cleaning module to their original cassette.

According to one embodiment of the present invention, the wafer transfer system comprises a transfer chamber having a wafer transfer blade disposed within the transfer chamber, a load lock chamber coupled to the transfer chamber, and a slider, located within the transfer chamber, which slider moves the wafer transfer blade between the transfer chamber and the load lock chamber while processing continues in parallel in the transfer chamber. The wafer transfer blade is capable of transferring a wafer between the transfer chamber and the load lock chamber.

In a preferred embodiment, the wafer transfer system comprises a transfer chamber having two wafer transfer blades disposed within the transfer chamber, two load lock chambers coupled to the transfer chamber and two sliders, located within the transfer chamber. One of the sliders moves one of the transfer blades between the transfer chamber and the first load lock chamber while processing continues in parallel in the transfer chamber. When all of the wafers in the first load lock chamber have been processed and returned to the first load lock chamber, the first load lock chamber is isolated from the transfer chamber, the second load lock chamber is opened to the transfer chamber and the second slider moves the second wafer transfer blade between the second load lock chamber and the transfer chamber. The second wafer transfer blade is likewise capable of transferring a wafer between the transfer chamber and the second load lock chamber while processing continues in parallel in the transfer chamber.

In a further embodiment, the present invention claims a method of processing and transferring a wafer in a system comprising a load lock chamber and a transfer chamber having a stage. The method comprises the following steps: providing radio-frequency (RF) power of a predetermined amount; providing a gas flow that will become a plasma; and determining a tact time, wherein the tact time is the sum of the processing time and the fin index time. The processing time is defined as the processing time that a wafer undergoes while on a processing stage. The fin index time is defined as the time that it takes for a first fin to transfer a wafer from one processing stage to another processing stage or between the wafer transfer blade and a processing stage. The loading time for the wafer substantially parallels the processing time and covers the following steps. First, the wafer transfer blade extends toward the load lock chamber to deposit the processed wafer into a shelf of the wafer holder. Second, the wafer transfer blade retracts. Third, the wafer holder indexes to the next wafer slot. Fourth, the wafer transfer blade extends and then the wafer holder indexes so that a new wafer is deposited on the wafer transfer blade. Finally, the wafer transfer blade retracts so that the new wafer is being processed in the transfer chamber. Thus, wafers are processed in the transfer chamber while new and processed wafers are transferred between the load lock chamber and the transfer chamber. The result is higher throughput, lower manufacturing costs, smaller space occupancy for the system and higher reliability.

The wafers in the second load lock chamber of the preferred embodiment of the present invention are manipulated in a similar manner as that described above. Once all of the wafers in the first load lock chamber have been processed and returned to the first load lock chamber, the second load lock chamber opens and the above cycle repeats with the wafers from the second load lock chamber. The use of a second load lock chamber increases throughput and reduces manufacturing costs to an even greater extent than the system with one load lock chamber. While wafers from one transfer chamber are being processed, unprocessed wafers can be loaded into the second transfer chamber and the chamber brought down to operating pressure. Immediately upon return of the last processed wafer back to the first load lock chamber, the first load lock chamber can be isolated from the transfer chamber by closing a slit valve, a similar slit valve at the second load lock chamber can be immediately opened and transferring and processing of wafers can begin. There is no time lost emptying processed wafers from a load lock chamber, reloading unprocessed wafers into it and reducing the pressure before processing can continue.

In another aspect, the present invention includes an apparatus having multiple plasma sources attached to a transfer chamber wherein the plasma structure generated by each of, or any combination of, plasma sources may be different. Each plasma source is directed toward a individual substrate within the transfer chamber. The stages on which the substrates rest during processing are independently temperature controlled. Thus substrates can be exposed to a multiplicity of processing environments within the same transfer chamber. If the processing environments are compatible with each other, two or more steps can be carried out simultaneously; if the processing environments are not compatible, the steps can be performed sequentially.

In yet another aspect, the present invention relates to a system consisting of a combination of two modules, a dry-stripping module and a wet-cleaning module, in a stacked configuration. In a preferred embodiment, the dry-stripping module is located substantially above the wet-cleaning module. Furthermore, in a preferred embodiment of this invention, the stages of the wet-cleaning module are disposed in a radial pattern so that wafers completing the wet-cleaning process will return to the starting point of the process from which position they can be automatically transported to the wafer cassettes from which they were originally obtained.

BRIEF DESCRIPTION OF THE DRAWINGS

The present invention is illustrated by way of example and not a limitation in the figures of the accompanying drawings in which like references indicate similar elements and in which:

FIG. 1B illustrates a prior art wet-cleaning apparatus and wafer exchange apparatus;

FIG. 5B illustrates a top view of a plasma source located above the processing states of an embodiment of the present invention having four processing stages;

FIG. 6B illustrates a top view of a wet-cleaning module;

DETAILED DESCRIPTION

A transfer system and method for using the same are described for processing a substrate, such as dry-stripping the resist from a wafer surface, in a transfer chamber while, at substantially the same time, another substrate or wafer is being transferred between a load lock chamber and the transfer chamber. A transfer system and method for using the same is also described for processing a substrate, such as dry stripping the resist from a wafer surface, while at substantially the same time another substrate is transferred between a first load lock chamber and the transfer chamber and a second load lock chamber is being loaded with other unprocessed substrates so that, when processing of all of the substrates in the first load lock chamber is finished, processing of the substrates in the second load lock chamber can begin without delay. In addition, a combination system for dry-stripping and wet-cleaning a wafer and returning it to its original wafer cassette is described. It should be noted that, in the following description, numerous specific details are given to provide a thorough understanding of the invention, such as the use of a magnetic motion coupling mechanism or the use of a vacuum chuck coupled to a platen. However, it will be obvious to one skilled in the art that the invention may be practiced without these specific details. Moreover, in some instances, well-known semiconductor equipment and processes have not been set forth in detail in order to not unnecessarily obscure the present invention.

Figure 1A:
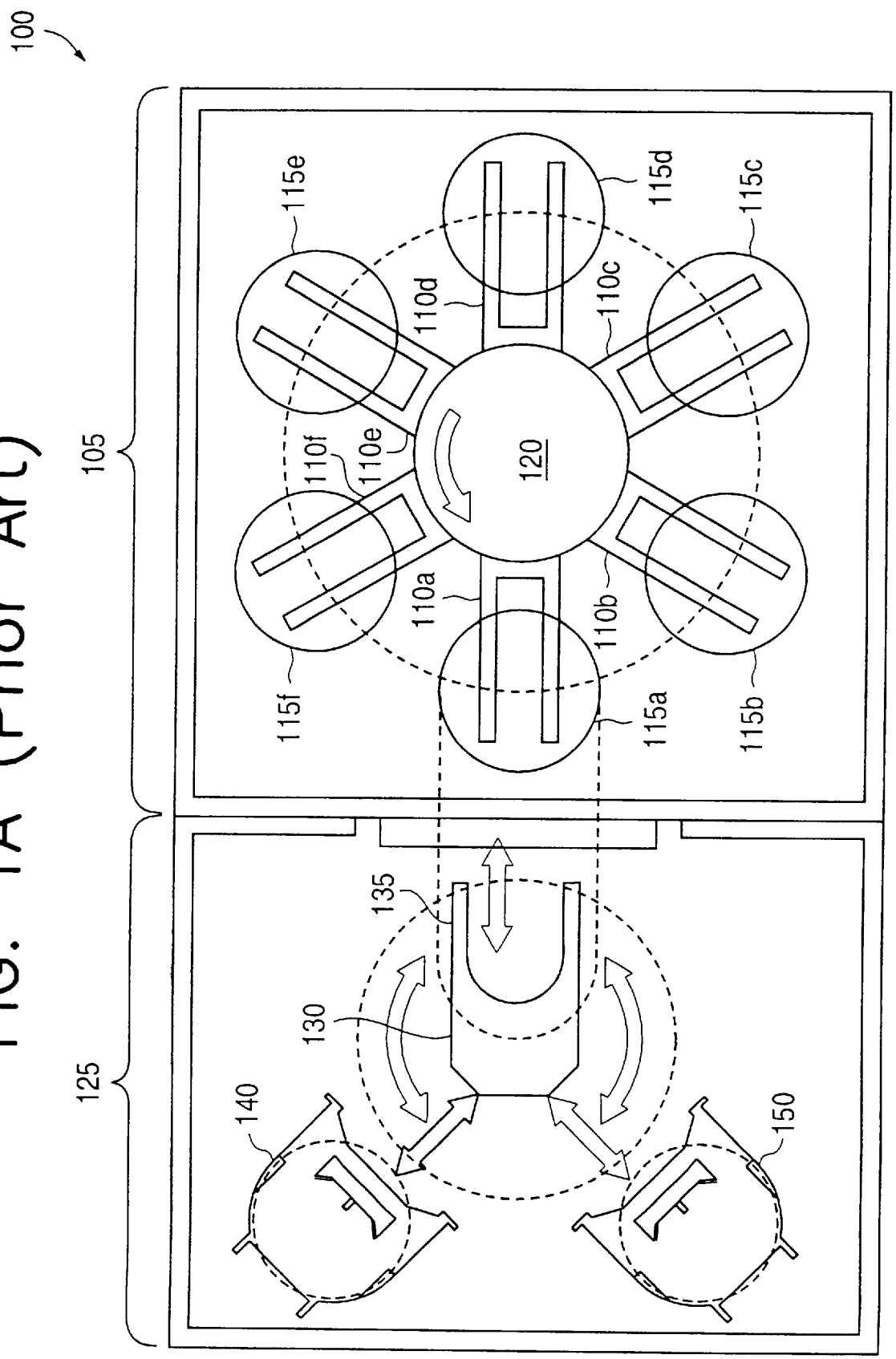
FIG. 1A illustrates a prior art dry-stripping apparatus.
Figure 2:
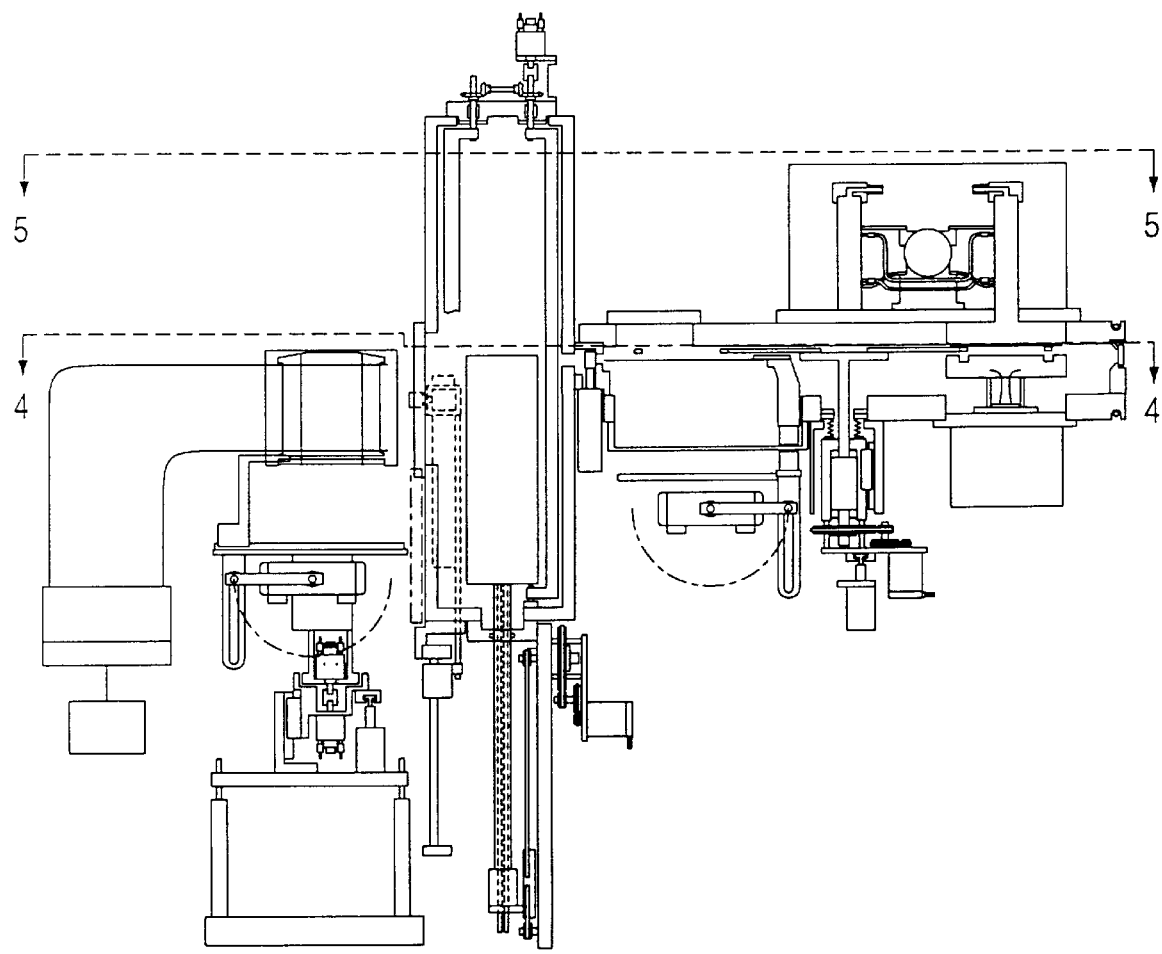
FIGS. 2, 2A and 2B illustrate a side view of a wafer transfer system of this invention.
Figure 2A:
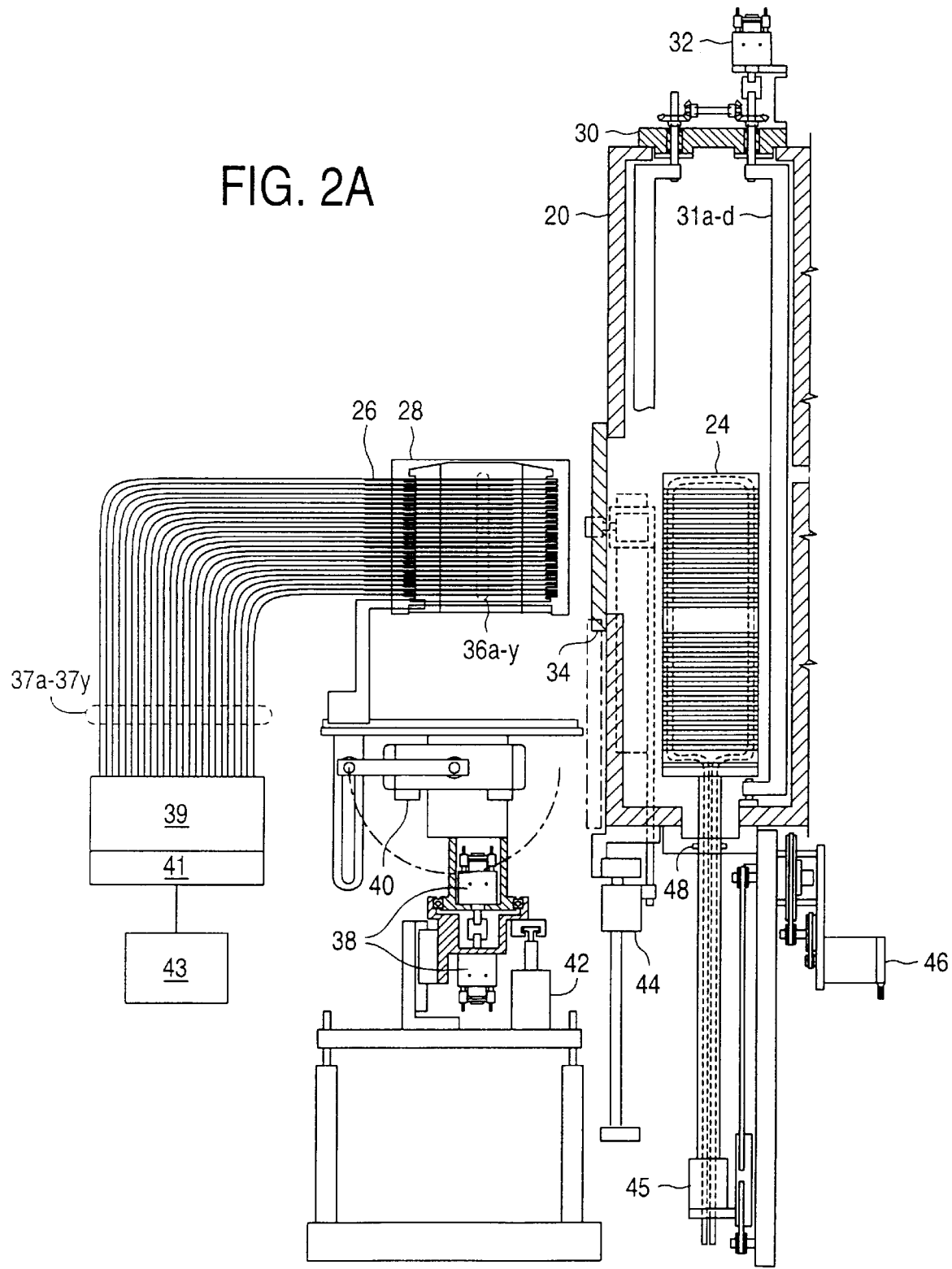
Figure 2B:
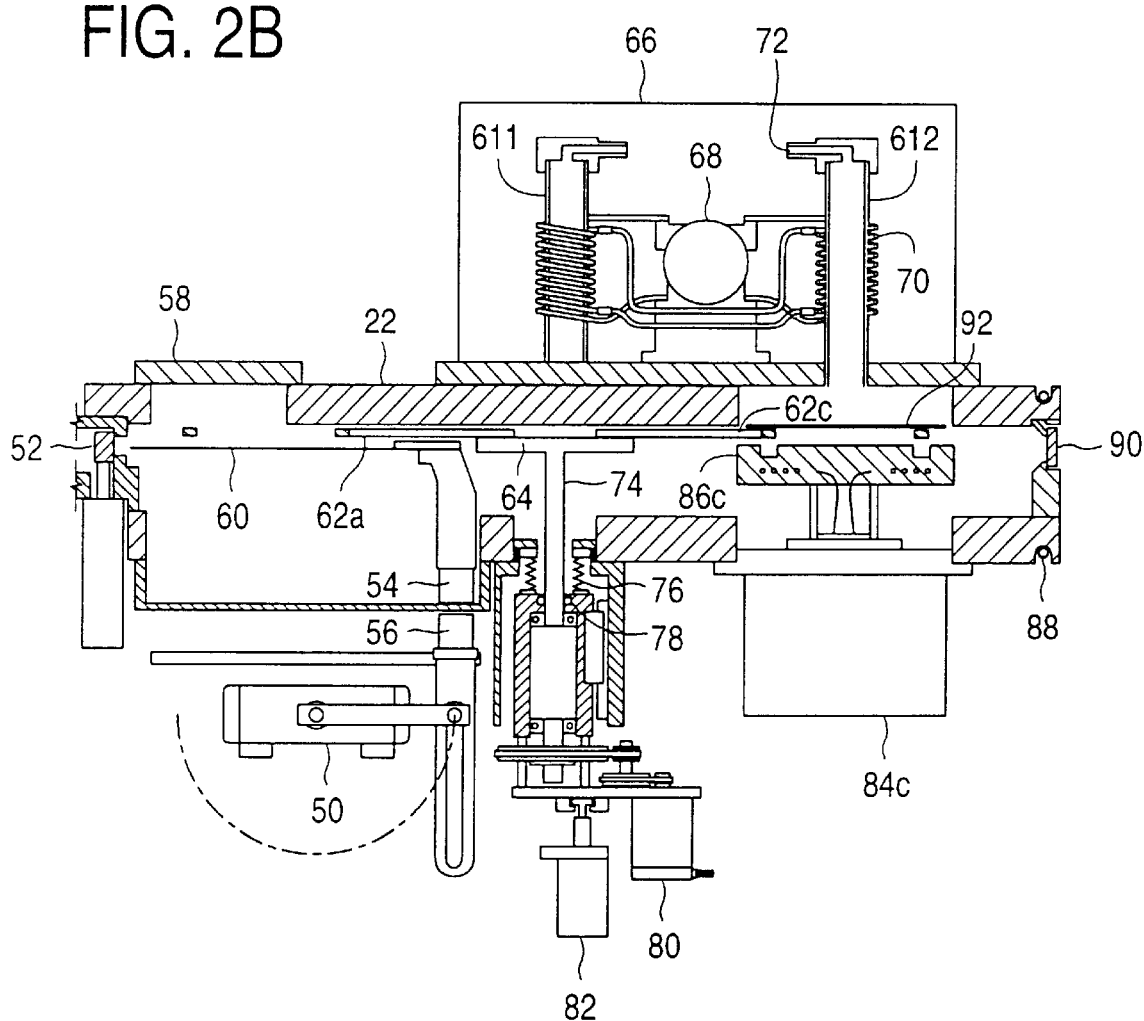

FIGS. 2, 2A and 2B illustrates a side view of a preferred embodiment of this invention, an apparatus and method for stripping the photoresist from a wafer surface, while at substantially the same time, another wafer is transferred between the load lock chamber and the transfer chamber. Cassette stages 28 are located outside a load lock chamber 20. Load lock chamber 20 is connected to a transfer chamber 22 where the processing of a wafer occurs. A wafer holder 24 having a plurality of shelves is located in load lock chamber 20. The wafer holder 24 has a plurality of shelves for holding wafers before the wafers are transferred between the robot 26 and the transfer chamber 22. In a preferred embodiment, wafer holder 24 has two compartments, wherein each compartment has twenty-five shelves and is capable of holding twenty-five wafers.

Cassettes holding a plurality of unprocessed wafers are placed on cassette stages 28. The cassettes may be placed on and removed from cassette stages 28 manually or, in another aspect of this invention, automatically, using an additional robot located remote to cassette stages 28.

The robot 26 retrieves a new (not yet processed in transfer chamber 22) wafer from cassette stage 28 located outside of the load lock chamber 20. According to a preferred embodiment, robot 26 has 25 platens 36a–36y which are capable of receiving twenty-five wafers at one time from cassette stage 28. Each of the platens 36a–36y has its own vacuum chuck for supporting a wafer during transport. Each platen 36a–36y is connected to its respective vacuum line 37a–37y which is connected to a manifold 39 which is then connected to a valve 41 and a vacuum pump 43.

A rotation pneumatic actuator 38 allows robot 26 to rotate between gate valve 34 of load lock chamber 20 and cassette stage 28. Gate valve 34 is opened whenever a wafer is being transferred between load lock chamber 20 and cassette stages 28. A retract-extend pneumatic actuator 40 allows robot 26 to extend toward cassette stage 28 or wafer holder 24 to either receive or transfer a wafer. Finally, an up-down pneumatic actuator 42 allows robot 26 to move up and down between the shelves of cassette stage 28 and the shelves of wafer holder 24. Unlike previous robots, the robot 26 is capable of receiving twenty-five wafers at one time from cassette stage 28 and then transferring all twenty-five wafers to the wafer holder 24. The converse of the prior sequence for robot 26 is also true. Thus, throughput is increased because atmospheric robot 26 is able to transfer more than one wafer at a time.

In another aspect of the present invention, wafer holder 24 has an additional compartment disposed directly beneath the two compartments which hold new and processed wafers. The additional compartment is likewise capable of holding a plurality of wafers; in a preferred embodiment of this invention the additional compartment has six (6) shelves capable of holding six (6) wafers. The additional compartment is used to hold dummy wafers; i.e., wafers which have not been coated with photoresist, exposed through a mask, etc. These dummy wafers are used in the following manner:

When the apparatus is in operation, the first five wafers and the last five wafers are processed with some of stages 86a–86f empty. However, some process applications are extremely sensitive to the overall processing environment and/or to the condition of the stages. That is, the first wafer through is a "pioneer" and at each of stages 86a–86f, it is the first wafer to be placed on and processed at that stage. The condition of the stage for the pioneer wafer is thus different than it will be for the second and all subsequent wafers which will be placed on each succeeding stage when the stage is vacated by the preceding wafer. Likewise, when there are less than six wafers remaining in transfer chamber 22 to be processed, one or more stages 86a–86f will be empty. Differences in the environment within transfer chamber 22 as the result of some stages being empty may have a deleterious effect on the last five wafers to be processed. The present invention eliminates both of these situations. The operator is provided with a recipe which can be invoked to load dummy wafers from the additional six-shelf compartment of wafer holder 24 onto one or more of stages 86a–86f. This can occur before or after actual wafers to be processed are loaded from wafer holder 24 into the transfer chamber 22. Thus, in one aspect, if a particular application is not sensitive to the overall environment in transfer chamber 22, a single dummy wafer may be loaded as the pioneer wafer and actual wafers to be processed loaded next. If the application is sensitive to the overall environment in transfer chamber 22, dummy wafers may be placed on all six stages 86a–86f before the first wafer to be processed is introduced into transfer chamber 22. Likewise, when the last five wafers are being processed, dummy wafers can be loaded behind the processing wafers; i.e., on the stages being vacated by the last of the processing wafers so that all stages always contain a wafer. The dummy wafers can be used for many processing cycles.

Referring to FIG. 2A, load lock chamber 20 has a wafer centering mechanism 30 controlled by a pneumatic actuator 32 which moves the four centering bars 31a–d to center the wafers within wafer holder 24 every time before a wafer is removed from wafer holder 24. Centering bars 31a–d are four vertical bars which operate in a synchronous manner on four rotating axes. In addition, load lock chamber 20 has a gate valve 34 which isolates it from the atmosphere and a slit valve 52 (see FIG. 2B) which isolates it from transfer chamber 22. Gate valve 34 remains closed when wafers are being processed in transfer chamber 22. The vertical motion of gate valve 34 is controlled by pneumatic actuator 44. In addition, motor 46 controls the up and down motion of is wafer holder 24 while linear motion vacuum seal 48 helps maintain the vertical motion of wafer holder 24. Moreover, wafer holder weight 45 is used as part of the counter balancing mechanism of load lock chamber 20, which is shown in greater detail in FIG. 3.

A service window 58 allows one to see the processing of a wafer in transfer chamber 22. A wafer transfer blade 60, located below service window 58, is retracted and extended by a pneumatic actuator 50. Pneumatic actuator 50 is coupled to a magnetic motion coupling mechanism comprising a first magnet 54 located within transfer chamber 22 and a second magnet 56 located outside transfer chamber 22. Unlike previous systems, wafer transfer blade 60 is located inside transfer chamber 22 which allows the transfer of wafers to occur at substantially the same time or in parallel with the processing of wafers. In addition, wafer transfer blade 60 does not replace a processing stage, there still being six processing stages 86a–86f available in addition to wafer transfer blade 60. Thus the inclusion of wafer transfer blade 60 inside transfer chamber 22 does not result in a reduction of throughput.

In order to reduce the possibility of contamination, wafer transfer blade 60 moves in response to a simple magnetic motion coupling mechanism instead of a complicated gear or machine set. When second magnet 56 moves, first magnet 54 also moves and since first magnet 54 is coupled to wafer transfer blade 60, wafer transfer blade 60 also moves. It is to be appreciated that wafer transfer blade 60 may move in response to another mechanism without departing from the spirit and scope of the present invention. When slit valve 52 is open, wafer transfer blade 60 is able to extend into load lock chamber 20 to either receive a new wafer or deposit a processed wafer into a shelf of wafer holder 24.

In a preferred embodiment, there are seven fins 62a–62g located in transfer chamber 22. Only two fins 62a and 62c are shown in FIG. 2B. Each of the seven fins 62a–62g are connected to a central hub 64 which is connected to a drive shaft 74, bellows 76 and a rotation vacuum seal 78. Therefore, all seven fins 62a–62g rotate and move simultaneously. The rotation movement of the fins 62a–62g from one wafer stage 86 to another is controlled by a fin rotation motor 80. There are six wafer processing stages 86a–86f (only 86c is shown in FIG. 2B) which are arranged with wafer transfer blade 60 in a concentric manner in transfer chamber 22. In addition, the vertical motion of the fin 62 as it moves up and away from, for example, wafer stage 86a and down toward wafer stage 86b, is controlled by pneumatic actuator 82. Each of the wafer stages 86a–86f has its own wafer stage controller 84a–84f but only one controller 84c is shown in FIG. 2B. A wafer 92 is shown on top of wafer stage 86.

Sometimes the temperature of transfer chamber 22 may be altered to facilitate processing. The temperature of transfer chamber 22 may be controlled by adding cold or hot water to a cooling or heating channel 88. There is also a view port 90 through which one can look at the color of the plasma to check for abnormalities during processing in transfer chamber 22.

The plasma source is located above wafer processing stages 86a–86f and is housed in RF shield 68 and comprises six quartz plasma tubes, but only two tubes 611, 612 are shown in FIG. 2B. RF shield 68 may be made of steel or aluminum. A gas inlet line 72 is shown entering a plasma tube 612 which is surrounded by an excitation coil 70 or an induction coil 70 which is wrapped around and coupled to two plasma tubes. A top view of the plasma source is discussed in FIG. 5 and one embodiment of its electrical circuit is illustrated in FIG. 6. An RF (radio frequency) tuner 68 is located between the two plasma tubes.

As used herein, the term "plasma tube" refers to a multiplicity of shapes and dimensions of vessels useful in the generation of plasmas including, but not limited to, a straight tube, circular in cross section with an outer wall and an inner wall, open at both ends and of varying length and diameter, a straight tube similar to the preceding but open at one end and closed at the other, curved tubes, half-dome structures, truncated half-domes, etc. The use of a plurality of any such vessels to produce a plurality of plasma sources within a transfer chamber is within the spirit of the invention.

Figure 3:
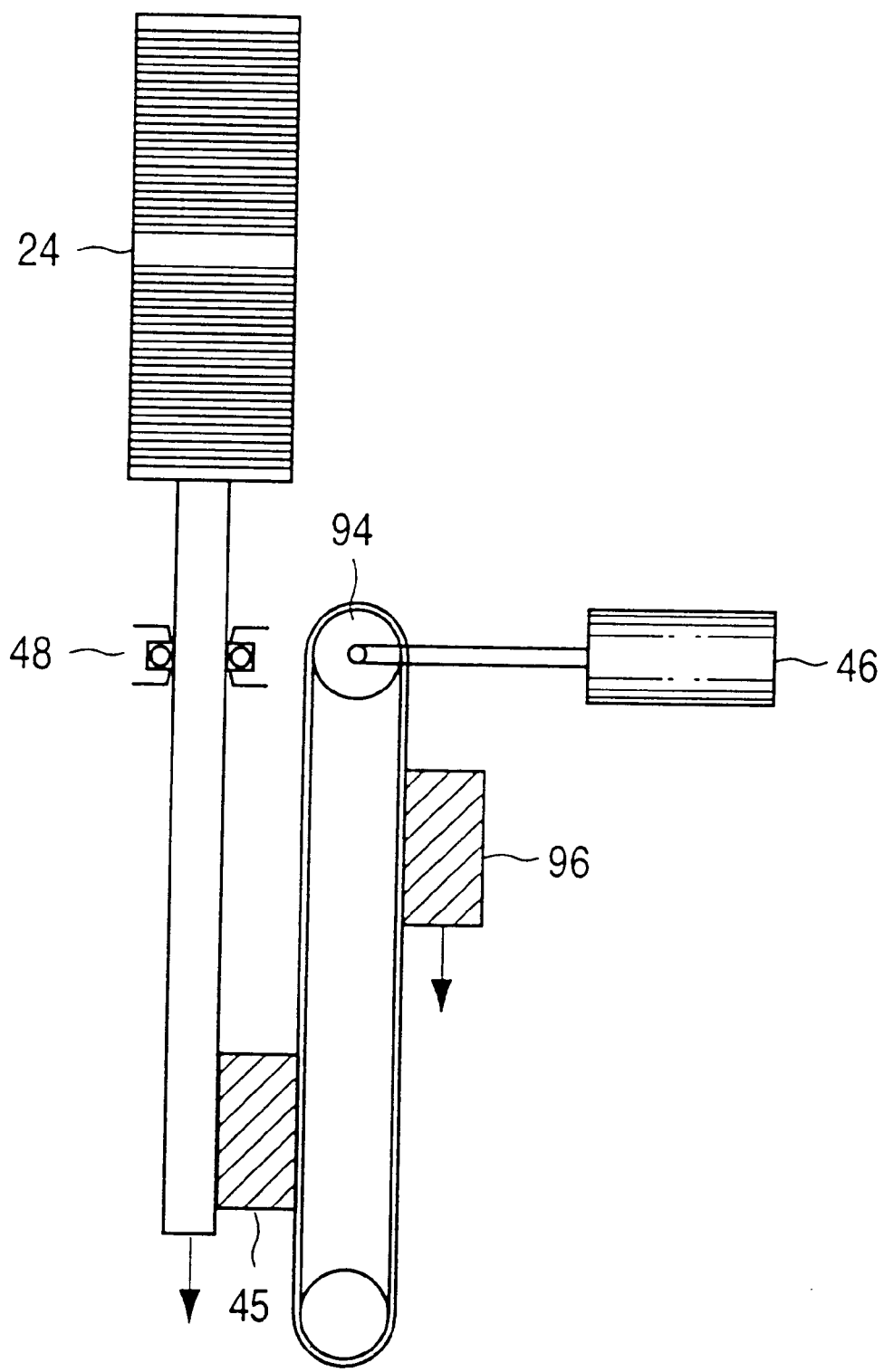
FIG. 3 illustrates a counterbalancing mechanism of a wafer holder disposed within a load lock chamber.

A preferred embodiment of the counterbalancing mechanism of wafer holder 24 is illustrated in FIG. 3. The counterbalancing mechanism prevents wafer holder 24 from crashing and dropping the fifty or less wafers within it because of a power failure. The wafer holder 24 is made of aluminum because the heat from the processed wafers received from the transfer chamber 22 would melt the prior art plastic shelves. Moreover, the plastic cassette holders absorbed quite a bit of moisture from the air which was then outgassed or released into the load lock chamber. This adversely affected the cleanliness of the environment of the load lock chamber. This outgassing effect is decreased by using an aluminum wafer holder 24 with aluminum shelves. In addition, it is easier to control the accuracy of the system with an aluminum wafer holder 24 than with a plastic cassette holder.

The wafer holder's 24 counterbalancing mechanism is accomplished by using a wafer holder weight 45 of about 15–20 pounds coupled to a drive pulley 94 which is coupled to a lead weight 96 of about 15 to 20 pounds. The drive pulley 94 is also coupled to motor 46 which controls the vertical motion of wafer holder 24. Friction provided by linear motion vacuum seal 48 assures that the wafer holder 24 will not move in the event of a power failure and that the two weights, wafer holder weight 45 and lead weight 96, will remain in the same place. This creates a tremendous cost savings because no wafers are damaged or destroyed during a power failure. The savings are amplified when there are processed wafers in wafer holder 24. In contrast, 25 under the prior art systems, the wafer holder dropped all the wafers when there was a power failure which resulted in a great financial loss and a decrease in throughput.

Figure 4A:
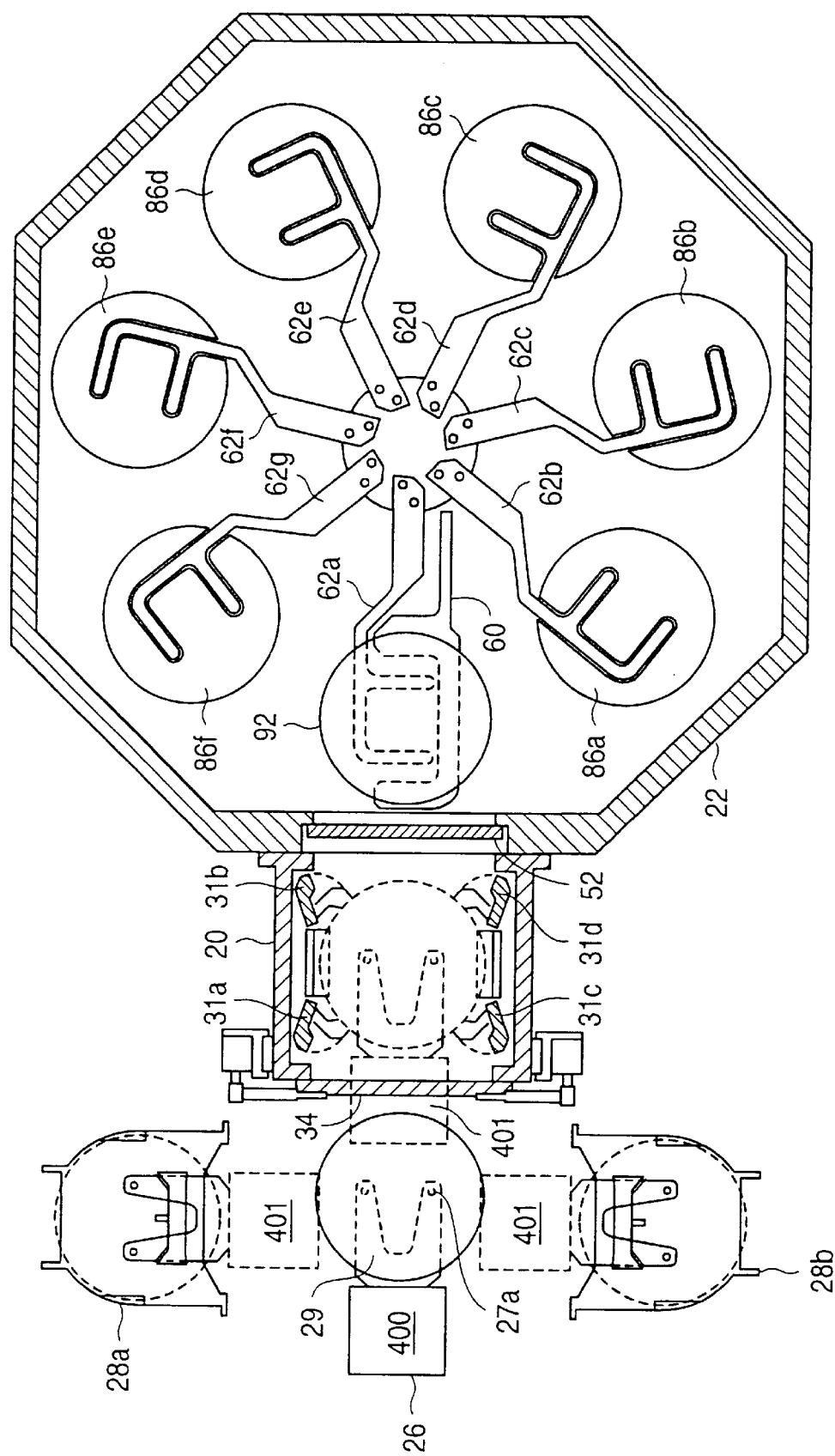
FIG. 4A illustrates a top view of an embodiment of the present invention which shows two wafer cassettes, one load lock chamber, one wafer transfer blade and six processing stages and seven fins of a transfer chamber.

FIG. 4A illustrates a cross section of the wafer transfer system along cut-away line 4 of FIG. 2. In a preferred embodiment, there are two cassette stages 28a and 28b and each of the cassette stages is capable of holding twenty five wafers. robot 26 is capable of moving from a home position 400 to an extended position 401 in which its platen 29 is extended into load lock chamber 20 and wafer holder 24 and then back to home position 400. The robot 26 is also in extended position 401 when it is transferring unprocessed wafers from cassette stage 28a, for example, to wafer holder 24 or when it is receiving processed wafers from wafer holder 24 and returning them to cassette stage 28a. This example assumes that the wafers originally came from cassette stage 28a.

A wafer 92 is shown resting on top of wafer transfer blade 60 and fin 62a. According to a preferred embodiment, wafer transfer blade 60 moves back and forth between load lock chamber 20 and transfer chamber 22. All seven fins 62a–62g are connected to a common central hub 64; thus, all seven fins 62a–62g move simultaneously in a counterclockwise direction when moving a wafer from one stage 86 to another stage 86 during processing. Each of the stages 86a–86f has its own independent temperature control. Thus, all the stages 86a–86f may be set at the same temperature or each at an entirely different temperature. Each fin 62 is capable of moving up with a wafer 92 on the end (not attached to central hub 64) and rotating in a counterclockwise direction to the next stage 86 and then downward with wafer 92 so that wafer 92 will rest on a different stage 86. In addition, the four centering bars 31a–31d also rotate to center the wafers within wafer holder 24 every time before a wafer is transferred. For example, centering bars 31b and 31d move toward each other to center a wafer before wafer transfer blade 60 extends into load lock chamber 20 to either receive or deposit a wafer 92.

Figure 4B:
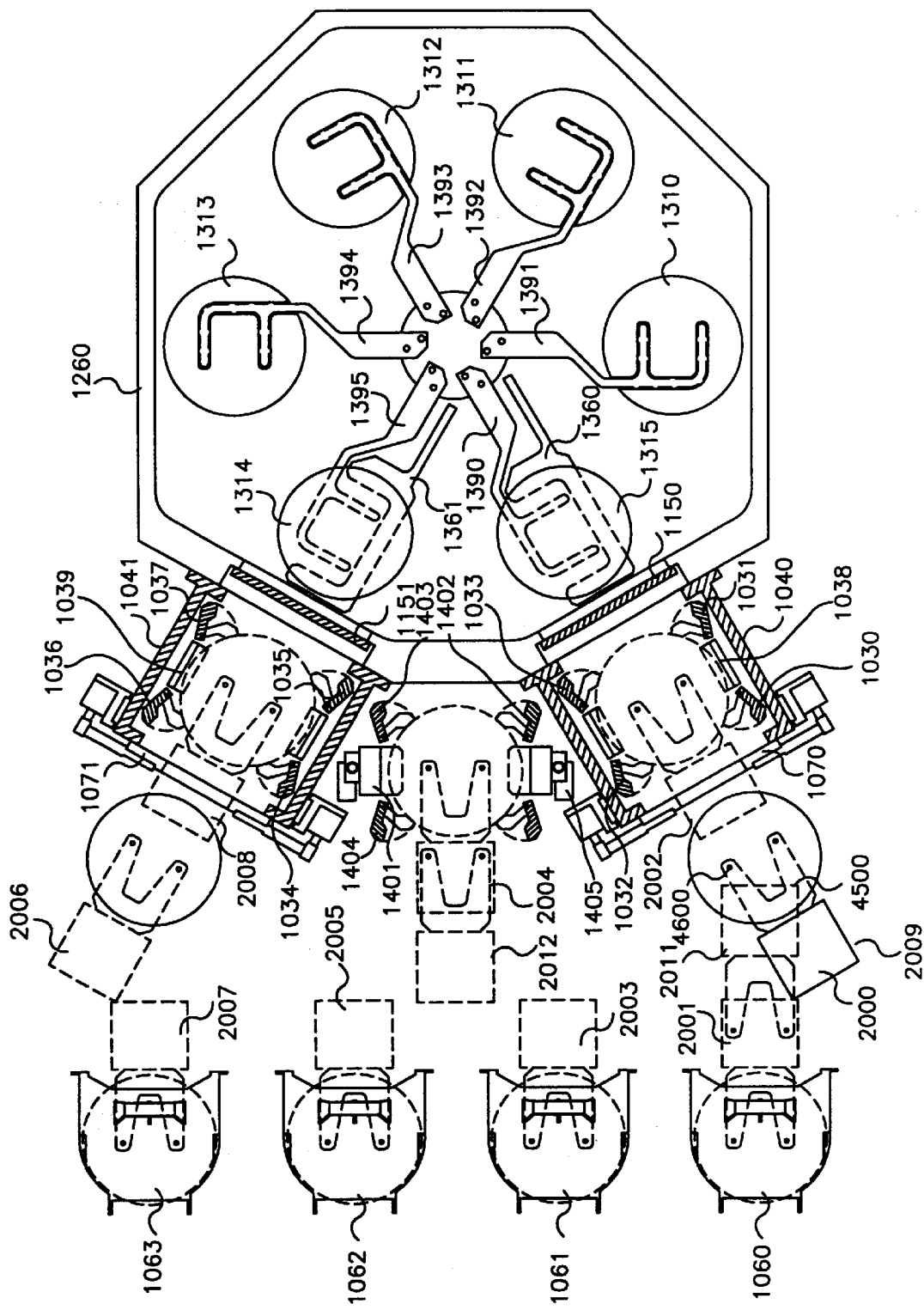
FIG. 4B illustrates a top view of another embodiment of the present invention which shows four wafer cassettes, two load lock chambers, two transfer blades and four processing stages and six fins of the transfer chamber.

FIG. 4B shows a top view of a presently preferred embodiment of this invention. In FIG. 4B, by way of example and not as a limitation, four cassette stages 1061–1063 are illustrated, each cassette stage being capable of holding twenty-five wafers. Robot 2000 is capable of moving from a home position 2009 to an extended positions 2002 and 2008 in which its platen 4500 is extended into either the first load lock chamber 1040 or the second load lock chamber 1041. Robot 2000 is also capable of moving from a home position to extended position 2011 for the purpose of obtaining unprocessed wafers from cassette holder 1060 or returning processed wafers to cassette holder 1060. Robot 2000 is likewise capable of moving to similar positions with respect to wafer cassettes 1061, 1062 and 1063 to obtain and return wafers to those cassettes. Finally, robot 2000 is capable of moving from the home position 2012 to an extended position 2004 in which wafers can be transferred to and from a wafer elevator car in a wafer elevator which can transport wafers which have completed processing in the dry-stripping module to the wet-cleaning, module.

Figure 5A:
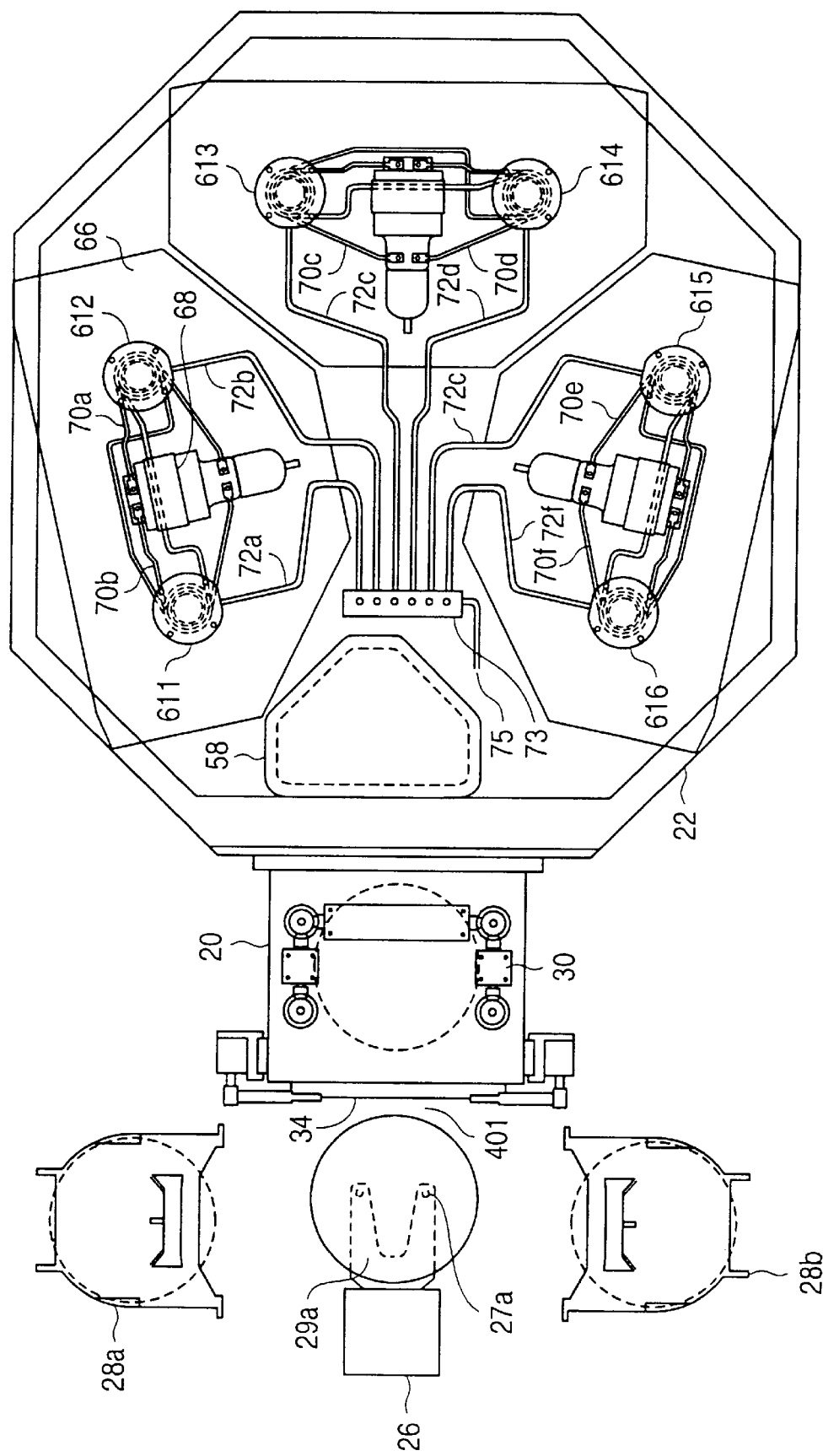
FIG. 5A illustrates a top view of a plasma source located above the processing stages of an embodiment of the present invention having six processing stages.

A cross section of the plasma source of the present invention is illustrated in FIG. 5A which is a cross section along, cut-away line 5 of FIG. 2. According, to a preferred embodiment, the plasma source comprises six plasma tubes 611–616, each plasma tube being located above a wafer processing stage 86a–86f. The plasma tubes 611–616 are arranged in three pairs. For example, plasma tube 611 is inductively coupled to plasma tube 612 utilizing two induction coils 70a and 70b. Thus, there are two sets of induction coils shared by each pair of plasma tubes. Induction coils 70c and 70d are shared between plasma tubes 613 and 614. Plasma tubes 615 and 616 share induction coils 70e and 70f. Each plasma tube pair shares an RF tuner 68 and an RF generator (not shown). Stripping gas, such as oxygen, enters through the main gas inlet 75, then enters gas divider 73 which divides into six different gas inlet lines 72a–72f. Each gas inlet line 72 is connected to a plasma tube. As the gas passes through the inductive coils which surround the plasma tube, it becomes a charged plasma with electrons, radicals and charged ionic species.

In another aspect of the present invention, one or more of gas inlet lines 72a–72f may not be connected to gas divider 73 but rather may be connected to a separate gas source. This permits different gases to be provided to one or more of plasma tubes 611–616.

Figure 7:
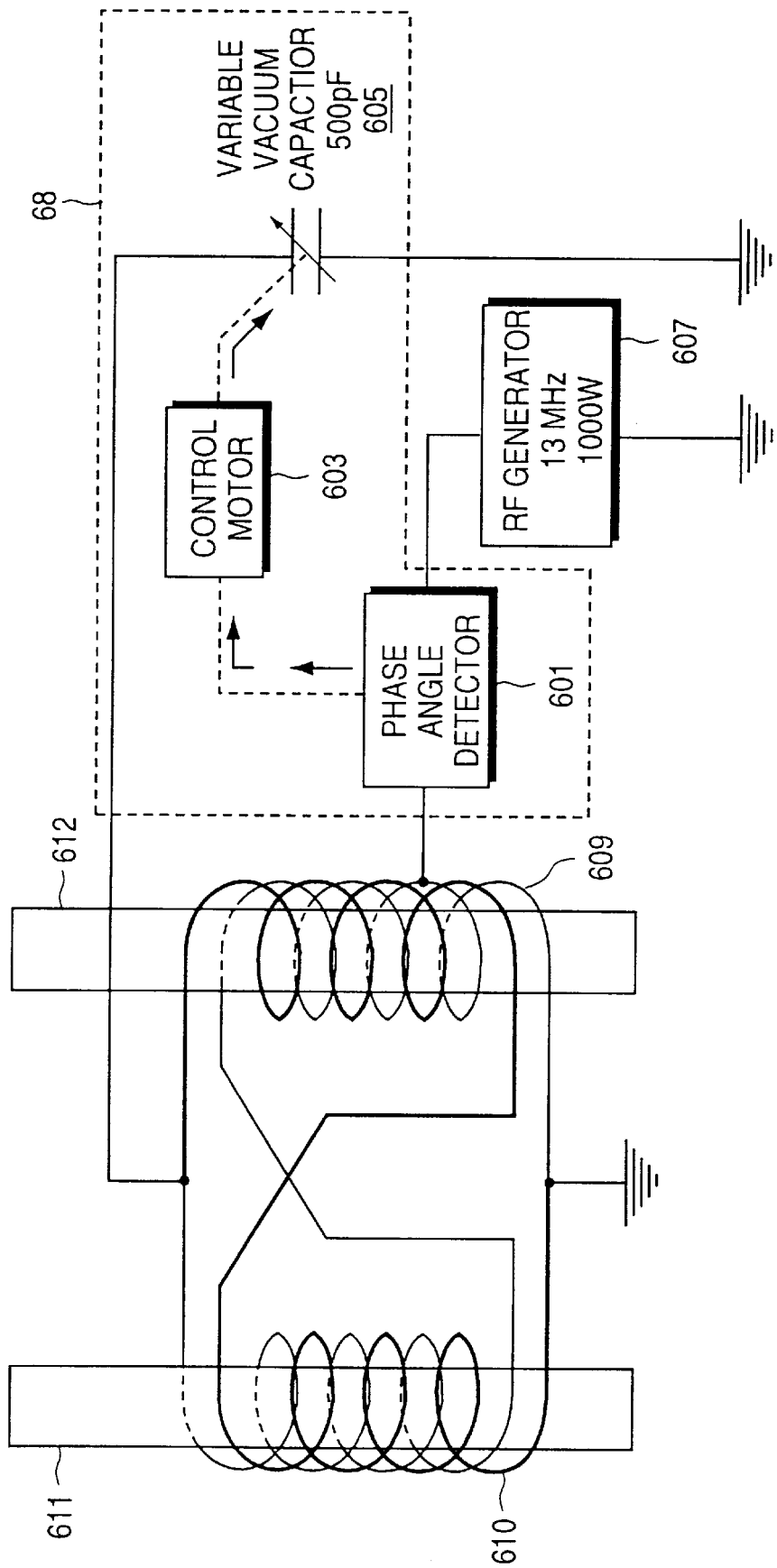
FIG. 7 illustrates one embodiment of an electrical circuit utilized in a plasma source of the present invention.

Referring to FIG. 7, one embodiment of the electrical circuit of the plasma source is illustrated as a schematic. RF tuner 68 houses a phase angle detector 601 which is coupled to a control motor 603 and a variable vacuum capacitor 605. The RF tuner is also coupled to an RF generator 607 which produces an RF current of about 13.56 MHz (megaHertz) and which generates about 700 to 1,000 watts of power. The phase angle detector 601 causes control motor 603 to adjust vacuum capacitor 605 so that the phase angle becomes 0 in order to maximize efficiency when the RF current is coupled to the plasma. If the phase angle is not 0, then the inductive coupling of the plasma source is not as efficient. That is, if the phase angle is not 0, only a fraction of the power provided by RF generator 607 is available to generate a plasma in plasma tubes 611 and 612. This results in a less than optimal plasma and degradation in performance at the wafer. The tuning of the phase angle to 0 is done in a conventional manner.

Unlike prior systems, copper induction coils 609 and 610 are coiled differently. Under conventional methods, two identical but separate coils are used so that one coil circles each tube and each coil is connected in parallel to the other coil. If there is a small geometrical difference between the wires or if there is a small difference in pressure between the two plasma tubes, then a difference in the plasma intensity between the two plasma tubes results. Thus, there would be an imbalance in the plasma intensity between the two plasma tubes. This imbalance becomes accelerated as more and more RF current tends to go to the brighter plasma tube (which has the greater plasma intensity). As a result, an uneven plasma is generated from the plasma tubes. The processing of the wafers below the plasma tubes is degraded because of an uneven etch rate caused by the difference in power densities between the plasma tubes. In addition, because one plasma tube is receiving more power, that plasma tube also tends to degrade at a faster rate than the dimmer (weaker plasma intensity) plasma tube. Thus, manufacturing costs increase when a plasma tube must be prematurely replaced.

In contrast, one embodiment of the present invention uses one copper wire 610 which is inductively coupled to both tubes 611 and 612 while another copper wire 609 is also inductively coupled to both tubes. The first end of induction coil 609 is connected to an RF power potential. It then wraps around plasma tube 612 then crosses over and circles plasma tube 611 and then its second end connects to ground. The mirror image occurs with induction coil 610. A first end of induction coil 610 connects to an RF power potential then wraps around plasma tube 611, then crosses over and circles plasma tube 612 and then its second end is connected to ground. The result is that small imbalances of plasma intensity between the two plasma tubes 611 and 612 will not cause more RF current to flow to the plasma tube with a slightly higher (brighter) plasma intensity. Since both induction coils 609 and 610 are equally coupled to both plasma tubes 611 and 612, an imbalance in RF current will not occur. Thus, both plasma tubes will provide an even etch rate to their respective wafers and the plasma tubes will not require premature replacement.

In a further aspect of the present invention, each pair of plasma tubes, 611/612, 613/614 and 615/616, is contained in a separate housing which has a hinge located at the intersection of the housing with the support surface of transfer chamber 22. The hinge is disposed such that the top of the plasma tube housing can rotate in a vertical plane about the hinge causing the top surface of the housing to swing out and down and thereby become perpendicular to the support surface of transfer chamber 22 with the top of the housing facing outward from the apparatus. The top cover plate is fastened to the housing with readily removable fasteners. Thus, easy access to the plasma source; i.e., the plasma tubes, the RF generator, the coils, etc., is provided thereby facilitating inspection, maintenance, part replacement etc. which results in minimal downtime for the apparatus.

The plasma generated by the plasma source can have different plasma structure depending on how it is generated. Of course, the particular gas used to generate the plasma is of prime importance. Other parameters which influence plasma structures include, but are not limited to, the RF power, ion filters, the method of initially creating the plasma and whether a single or dual source is used. By way of example and not limitation, RF power may be supplied in a broad spectrum of powers such as 2.45 GHz, 13.56 MHZ and 400 KHz. Ion filters may or may not be used and if they are used they may be metallic; e.g., aluminum, or non-metallic; e.g., quartz. The plasma may be initially created inductively or capacitively.

In a further aspect of this invention, each coupled pair of plasma tubes; i.e., plasma tubes 611/612, 613/614 and 615/616 may independently generate a different plasma structure within transfer chamber 22. In one embodiment, these different plasma structures may be generated simultaneously so that wafers on, for example, stages 86a and 86b are exposed to one plasma structure while, at the same time, wafers on stages 86c and 86d are exposed to a second plasma structure and wafers on stages 86e and 86f are exposed to yet a third plasma structure. Of course, the plasmas being simultaneously generated must be compatible; i.e. they must not interact and adversely affect the processing of wafers. For example, but without limitation, oxygen and carbon tetrafluoride generate plasmas which are compatible and may exist simultaneously in a processing environment. Other such compatible plasmas are well known to those skilled in the art or can be determined with minimum experimentation.

It is also an embodiment of this invention to generate different plasma structures sequentially so that two wafers can be subjected to one plasma structure on, for example, stages 86a and 86b then, when processing at those stages is completed, the plasma source is turned off, the wafers moved to stages 86c and 86d and there exposed to a second plasma structure. When processing is complete at these stages, that plasma source is turned off, the wafers are moved to stages 86e and 86f and subjected to yet a third plasma structure. When processing is complete at these stages, the completely processed wafers are removed to load lock chamber 20, two new wafers are brought into transfer chamber 22 and the cycle repeated. An advantage of the sequential procedure is that another variable, processing pressure, can also be changed from step to step.

It is further possible to divide the stages into two sets of three wherein each set of three stages provides a different processing environment; for instance, stages 86a/86b/86c may provide one processing environment based on stage temperature and the structure of the plasma generated by plasma tubes 614, 615 and 616 and stages 86c, 86d and 86e may provide an altogether different processing environment, again, depending on the stage temperature selected for those stages and the structure of the plasma produced by plasma tubes 611, 612 and 613. The production of different plasmas in each of inductively coupled plasma tubes 613 and 614 is possible if the characteristics of the gases used, e.g., their impedances, are sufficiently similar. The characteristics of gases used to produce plasmas are well known to those skilled in the art; thus determining which gasses would be compatible so as to permit different plasma structures in two inductively coupled tubes such as 613 and 614 would be a simple matter for such skilled artisans to determine.

Of course, as noted previously, the temperature at each of stages 86a–86f is independently controllable so that the temperature at each stage may be different from that at any other stage(s), as desired.

The net result of the above is that complex multi-step processing may be carried out in a highly efficient manner.

The versatility and capability of the present invention is demonstrated in the following description of applications, which are provided by way of example only and are not to be construed as limiting in any way. One such application is termed in the art "ashing and light etch." This application consists of two steps, 1) photoresist removal; and, 2) poly-silicon oxidation layer removal. The first step is typically performed using an oxygen plasma and a 200° C. stage temperature. The second step is usually performed using carbon tetrafluoride and a lower stage temperature. Previously, the two steps required the use of two separate pieces of apparatus resulting in high operational costs. Using the present invention, not only can the entire application be carried out in one apparatus, the two steps can be performed essentially simultaneously. That is, the apparatus of the invention may be configured so that stages 86a and 86b are set at 200° C. and corresponding plasma tubes 616 and 615 are set to produce a conventional oxygen plasma. Stages 86e and 86f are then set to a lower temperature and plasma tubes 611 and 612 are set to produce a carbon tetrafluoride plasma. Two wafers are loaded onto stages 86a and 86b and exposed to the oxygen plasma. When processing is completed, the processed wafers are moved to stages 86e and 86f while, at the same time, new wafers are transferred to stages 86a and 86b. Then, while the oxygen plasma source (plasma tubes 616 and 615) processes the new wafers just transferred to stages 86a and 86b, the carbon tetrafluoride plasma source simultaneously performs the second processing step on the partially processed wafers which were transferred from stages 86a and 86b to stages 86e and 86f. When both processing steps are complete, the wafers on stages 86e and 86f are removed from the transfer chamber, the wafers on stages 86a and 86b are moved to stages 86e and 86f, new wafers are loaded onto stages 86a and 86b and the cycle is repeated.

An even more complex application which may be carried out using the present invention is termed in the art "post poly etch side wall removal." This application consists of four (4) steps: 1) photoresist removal accomplished by an oxygen plasma at a stage temperature of 200° C.; 2) silicon-containing side-wall removal which is typically done with carbon tetrafluoride plasma at a stage temperature which is essentially room temperature; 3) carbon-containing side-wall removal, done with an oxygen plasma at a 200° C. stage temperature; and, finally, 4) oxidation layer removal which is accomplished by a plasma produced from a combination of oxygen and carbon tetrafluoride at, again, room temperature stage temperature. The stages and plasma sources are set so that, for example, stages 86a and 86b are set at 200° C. while stages 86c, 86d, 86e and 86f are held at room temperature. Plasma tubes 616 and 615 are set to generate an oxygen plasma. Plasma tubes 613 and 614 are set to produce a carbon tetrafluoride plasma. Plasma tubes 615 and 616 are prepared to generate an oxygen/carbon tetrafluoride combination plasma. For this application, only two wafers are loaded into transfer chamber 22 at a time. The wafers are first placed on stages 86a and 86b and step 1) carried out. The plasma source is then turned off at plasma tubes 616 and 615 and the wafers are moved to stages 86c and 86d is where step 2) is performed. When processing is complete, plasma generation by plasma tubes 613 and 614 is ceased and the wafers are moved back to stages 86a and 86b where a plasma is once again generated from plasma tubes 616 and 615 and step 3) is carried out. Next, plasma generation at plasma tubes 616 and 615 is once again stopped, the wafers are moved to stages 86e and 86f, the oxygen/carbon tetrafluoride combination plasma is created and step 4) is accomplished. When step 40 is complete, the two fully processed wafers are removed from transfer chamber 22 to load lock chamber 20, two new wafers are transferred from load lock chamber 20 to transfer chamber 22 and the cycle is repeated. Thus, an extremely complicated application is carried out in one apparatus. No manipulation of stage temperatures or plasma sources other than initial set up, stage temperature adjustment and the turning on and off of the three different plasma sources is required. These manipulations are easily performed, and, in fact may be programmed into a recipe which permits automatic performance of the entire cycle, including removal of fully processed wafers from the transfer chamber and introduction of new wafers into the transfer chamber to begin a new cycle.

In the presently preferred embodiment illustrated in FIG. 4B, there are four rather than six processing stages; i.e., stages 1310–1313 which have plasma sources located above them, the other two stages 1314 and 1315 being loading and unloading stages. The arrangement of the plasma sources above stages 1310–1313 is illustrated in FIG. 5B. It will be apparent, however, to those skilled in the art that the preceding description of processes using the present invention with six processing stages is readily adaptable to four processing stages and, in fact, that a wide variety of number and arrangement of plasma sources, stage temperatures, processing sequences, etc. to carry out the above and other applications using the present invention are readily accessible given the disclosures herein and are within the spirit and scope of this invention.

Figure 8:
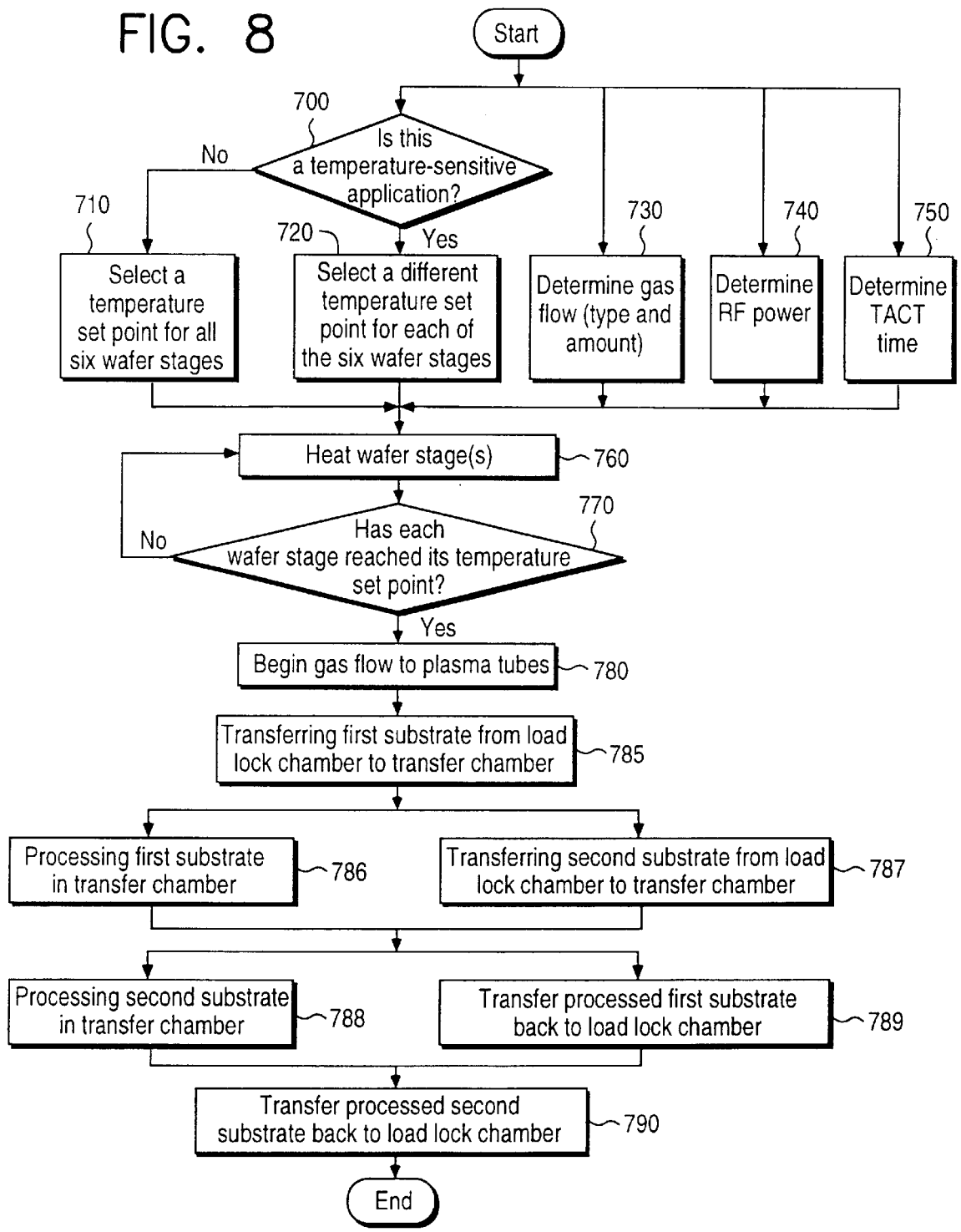
FIG. 8 is a flow chart of a preferred method of the present invention.
Figure 9:
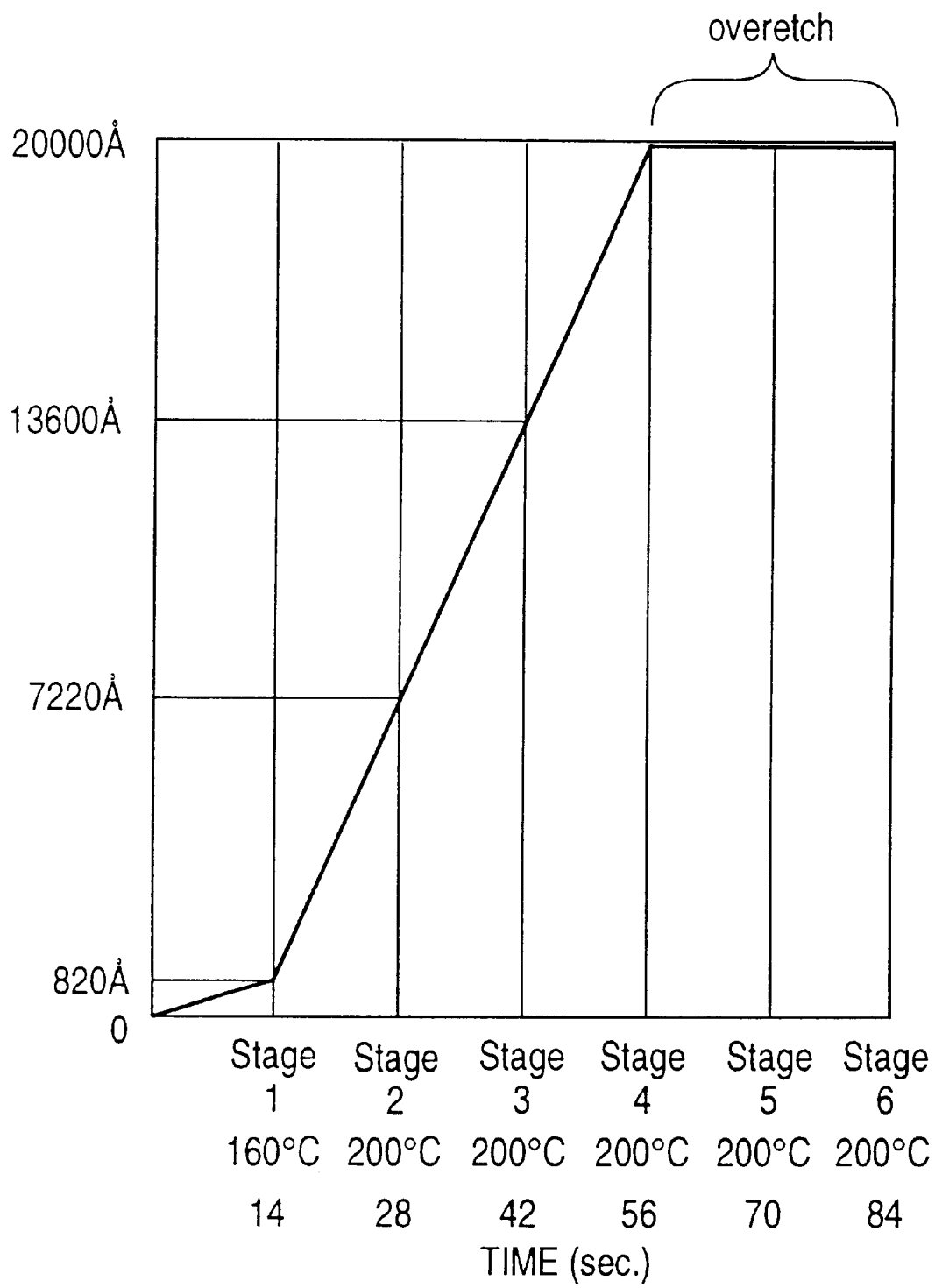
FIG. 9 is a graph illustrating the amount of resist removed over time utilizing a non-temperature sensitive application of the present invention; and, FIG. 10 is a graph illustrating the amount of resist removed over time per processing stage based on a temperature sensitive application of the present invention.

A flow chart of a preferred method of the present invention is illustrated in FIG. 8. According to a preferred embodiment, an operator selects a recipe by determining certain parameters using a type of control system, such as a computer program. As shown in diamond 700, an operator decides whether a temperature sensitive application is desired. If a non temperature sensitive application is selected, then the operator may select a temperature set point for all six wafer stages as shown in block 710 or a common temperature set point for five of the six wafer stages as shown in FIG. 9. Stripping of the photoresist off the wafer surface after etching a contact or a via is an example of a non-temperature sensitive application of the present invention.

If a temperature sensitive application is desired, then the operator will select a different set point for each of the six wafer processing stages, as shown in block 720. Photoresist removal after an ion implantation step (e.g., a heavy arsenic dope) is an example of a temperature sensitive application. Because each of the six wafer processing stages has its own temperature control, it provides the advantage of allowing a slow heat-up during the photoresist strip process. If the wafer surface is exposed to an abrupt increase in temperature, then good process performance is not obtained because of a phenomenon known as "explosion" of the resist film. In other words, the photoresist film explodes if the wafer is heated too suddenly. The present invention is designed to avoid "explosion" by the gradual heat-up of the wafer and also by applying RF power incrementally since the RF power also adds heat to the wafer surface. In parallel, an operator may also determine the gas flow, such as the type and the amount in sccm (standard cubic centimeters) of gas provided as shown in block 730.

In tandem, an operator may determine the amount of RF power to be provided and the tact time, as shown in blocks 740 and 750, respectively. The RF power provided may be selected from a range of about 1 kilowatt (kw) 10 kw. The radio frequency applied is between about 200 kiloHertz (kHz)–27 megaHertz. According to a preferred embodiment, 3 kw of power is provided and the radio frequency is set at about 13 MHZ. The tact time is defined as processing time plus fin index time. Theoretically, the tact time selected may be anywhere from twenty seconds to infinity. A typical tact time is 20 seconds which is significantly lower than the tact time of 42 seconds obtained under the prior art system 100. The processing time is the amount of time that a wafer spends on a processing stage. As earlier defined, the fin index time is the time it takes for one fin to move up from a first stage while carrying a wafer, rotating to a second stage, then moving down and depositing that wafer on the second stage. The fin index time may be set anywhere from twelve seconds to infinity. Although from a throughput perspective, a lower fin index time is desirable. According to a preferred embodiment, the fin index time is twelve seconds. The vacuum pressure inside the transfer chamber may be set from atmospheric pressure to 10–7 torr However, a vacuum pressure of 5 torr is selected under a preferred embodiment.

Once the temperature set point is selected for each of the six wafer processing stages, then heat is immediately provided to the wafer processing stages as shown in block 760. In one embodiment, an operator places from one to twenty-five wafers-into a cassette stage. An operator may also use two cassette stages. An operator may choose to put twenty-five wafers into a cassette stage or only one. If an operator places one wafer at the top shelf of the cassette stage and then another one at the bottom of the same cassette stage, the system will assume that there are wafers in the empty shelves so as not to degrade tact time. The amount of time that a wafer spends in the transfer chamber is critical because that is when the wafer is exposed to the plasma under a certain temperature. Thus, the present invention is designed so that a wafer will get the same amount of processing time regardless of whether there are two wafers or twenty-five wafers in a cassette stage. Thus, process performance does not decline if less than the maximum number of wafers is processed in the transfer chamber.

As shown in diamond 770, the system will check to see if each wafer processing stage has reached its temperature set point. If the answer is yes, the system will begin gas flow to the plasma tubes as shown in block 780. According to a preferred embodiment, a gas flow comprising 80% of $O_2$ gas and 20% of $N_2$ gas is used. By this point, the system is operating automatically based on the selected parameters. It is to be appreciated that the parameters may be pre-selected in the software without departing from the spirit and scope of the patent invention.

Before transferring a first substrate or wafer from the load lock chamber to the transfer chamber as shown in block 785, the system will go through several checkpoints. First, the system will check to see if there are any wafers present in the wafer holder or on the fins. If no wafers are found, then the system begins the transfer sequence. Second, the system will check to make sure that the load lock chamber is at atmospheric pressure. If the system determines that the gate valve is open then it will proceed to the next step, but if the gate valve is not open, the system will open the gate valve to bring the load lock chamber to pressure.

The atmospheric robot will rotate to the first cassette stage, and then extend its twenty-five platens into first cassette stage to pick up, for example, twenty-five wafers. Without touching the wafers, the robot will fully extend its twenty-five platens which are then moved up by about 0.1 inch. Next, the vacuum chuck for each platen is turned on in order to hold each wafer in place. Each of the platens will then retract and return back to home position. The robot then rotates toward the load lock chamber. The twenty-five platens then extend away from the robot and into the load lock chamber. The vacuum chuck then releases so that there is no more vacuum suction on the platens. The wafer holder moves up by 0.1 inch in order to pick up all twenty-five wafers from the platens. The twenty-five wafers are then transferred into the twenty-five shelves of the first or second compartment of the wafer holder. The centering mechanism then closes to center the wafers then opens again. The twenty-five platens retract back to home position.

Two events happen simultaneously. The wafer holder moves to the next compartment so that the next compartment's shelves are adjacent to the gate valve and are ready to receive the next twenty-five wafers from a second cassette stage. This example assumes the operator wants to process fifty wafers. At the same time, the atmospheric robot will repeat the same sequence for the second cassette stage as it retrieves the twenty-five wafers and transfers them to the wafer holder. While this has been happening, the transfer chamber has been under vacuum and the slit valve has been closed. Once the atmospheric robot has finished transferring the twenty-five wafers from the second cassette stage into the wafer holder, the gate valve is closed.

The load lock chamber is then pumped down from atmospheric pressure until it reaches the same pressure as the transfer chamber. At the same time, the wafer transfer system begins flowing gas into the plasma generation tubes and controlling the transfer chamber pressure by controlling a throttle valve (which is not shown). The transfer chamber is generally at a pressure of about 200 milliTorr (mT) when the wafer transfer system is idle. As shown in diamond 770 and block 780, the system will not start the gas flow until each of the wafer processing stages has reached its temperature set point. During the processing of wafers, the transfer chamber is set at about 2,000 mT according to a preferred embodiment. In one embodiment, about 5,000 sccm $O_2$ (oxygen) gas is released into the plasma tubes. In yet another embodiment, 500 sccm of $N_2$ (nitrogen) gas is also released with the $O_2$ gas into the plasma tubes.

In order to ignite the plasma, the wafer transfer system will provide the selected amount of RF power. By that time, the load lock chamber should be at the same pressure as the transfer chamber. The phase angle detector starts measuring the phase angle between the RF generator signal and the signal through the induction coil. The difference in phase angle between the two signals is sent to the control motor as part of a feedback control loop. The control motor then adjusts the vacuum capacitor in order to set the phase angle at 0. The vacuum capacitor, in turn, controls the phase of the RF current provided to the induction coils. The transfer chamber is now ready to receive wafers for processing as the pressure, the gas flow, the temperature of wafer processing stages and the RF power are all within a predetermined range.

The slit valve is opened and the transfer sequence (see block 785) begins in order to allow processing of a first wafer in the transfer chamber as shown in block 786. The wafer holder will move to a shelf where the first wafer is located, often it is the top shelf; however, an operator may set the system so that the first wafer is at the bottom of the wafer holder and the last wafer is on the top shelf. The wafer transfer blade will extend into the wafer holder and at the same time, the centering bars will center the wafers by moving toward each other and then opening. The wafer transfer blade is inserted beneath the first wafer which is on the top shelf. The wafer holder will then move down by about 0.1 inch so that the wafer is now resting on the wafer transfer blade. The wafer transfer blade retracts to home position so that it and the wafer are within the transfer chamber. A wafer is processed the moment the wafer enters the transfer chamber as the plasma immediately begins to strip the resist from the wafer surface.

The fin index motion occurs when the wafer is resting on the wafer transfer blade and a first fin. This first fin will then move up and then rotate by about 51.7 degrees to a first processing stage and then it will move down until the wafer rests on a first stage. At the same time, the wafer holder will move up to expose a second wafer on the shelf beneath the top shelf. A second wafer (or substrate) is transferred from the load lock chamber and into the transfer chamber, as shown in block 787, during the processing of the first wafer as seen in block 786. The entire sequence is repeated six times until there are six wafers and each wafer is on one of the six processing stages within the transfer chamber. All six stages are connected to ground in one embodiment. However, in another embodiment, the first processing stage, which is located in a counterclockwise direction from the wafer transfer blade, may be RF biased in order to process a particularly hardened resist known as a "shell" on the wafer surface.

Once the first wafer has been processed on each of the stages and is on the sixth processing stage, the fin index motion transfers that first wafer back to the wafer transfer blade. The wafer holder which was on the sixth shelf will now move back to the top shelf where this first wafer originated. The wafer transfer blade then extends into the top shelf of the wafer holder. The wafer holder moves up by about 0.1 inch so that the processed wafer is returned to the top shelf. The wafer transfer blade then retracts to home position so that it is inside the transfer chamber. At the same time, the wafer holder will then move to the seyenth shelf so that the wafer transfer blade may then pick up and transfer this unprocessed seventh wafer into the transfer chamber. After the seventh wafer is introduced into the transfer chamber, the system repeats the above transfer sequence thirty-six times. Each wafer is transferred from stage to stage until each wafer has been processed on all six stages. The unloading sequence is repeated a final seven times when the last seven processed wafers are unloaded from the transfer chamber and returned to their original shelves on the wafer holder. As shown in blocks 788 and 789, a processed wafer may be returned to the load lock chamber while another wafer continues to be processed in the transfer chamber. At the end of the process, all of the wafers are returned to their original shelves in the wafer holder as shown in block 790.

It is to be understood that the present invention may also be used in a standard batch processing format wherein six new wafers are loaded into the transfer chamber, all six wafers are simultaneously processed under substantially the same conditions, all six processed wafers are removed, six more new wafers are transferred into the transfer chamber and the process repeated.

It is also to be appreciated that the stripping of photoresist from the wafer surface is not the only process that can occur in the transfer chamber. Light etching after a film deposition or a chemical vapor deposition may occur utilizing the present invention. If a chemical vapor deposition process is utilized under the present invention, the plasma source is capacitively coupled instead of inductively coupled.

Once all fifty processed wafers are returned to their original shelves in the wafer holder, the slit valve is closed so that the load lock chamber is isolated from the transfer chamber. It is to be appreciated that the system may process less than fifty wafers at one time. The wafer transfer system then turns the RF power off and stops gas flow into the plasma tubes. The throttle valve is then opened to bring the pressure in the transfer chamber back to its base pressure of about 200 mT. The wafer transfer system starts introducing nitrogen gas into the load lock chamber for venting purposes. In a preferred embodiment, about 100 sccm of nitrogen gas will be introduced until the pressure in the load lock chamber reaches about 10 torr and then the main venting valve (not shown) is opened until the pressure in the load lock chamber reaches atmospheric pressure.

The gate valve is then opened and another wafer unloading sequence begins. First, the centering bar mechanism centers the wafers in the wafer holder. Second, the robot extends its twenty-five platens into the wafer holder. The centering mechanism then opens after centering the wafers. The wafer holder then moves down by about 0.1 inch so that all twenty-five wafers are resting on the twenty-five platens. The vacuum chuck for each platen is turned on so that each wafer is chucked onto its respective platen. The platens retract back to home position. Next, the robot rotates with its twenty-five platens toward the first cassette stage. The robot will then extend its twenty-five platens toward the first cassette stage. The vacuum chuck is then turned off and the atmospheric robot moves down by about 0.1 inch so that all twenty-five platens retract to home position after the twenty-five wafers are returned to their original shelves in the first cassette stage. In parallel motion, as the robot is rotating toward the first cassette stage, the wafer holder is moving its second compartment upward so that the next twenty-five wafers may then be unloaded and returned to their original slots in the second cassette stage. This example assumes that fifty wafers were processed.

The operation of the presently preferred embodiment of this invention with two load lock chambers and four wafer cassette stages as illustrated in FIG. 4B is described below. That is, robot 2000 moves to the first cassette stage 1060, rotates to face the cassette stage and then extend its twenty-five platens 4500 into first cassette stage 1060 to pick up, for example, twenty-five wafers. Without touching the wafers, the robot 2000 extends its twenty-five platens which are then moved up by about 0.1 inch. The vacuum chuck 4600 for each platen is turned on to hold each wafer in place. Each of the platens then retracts and return back to home position. The robot 2000 moves to the first load lock chamber 1040 and rotates toward it. The twenty-five platens extend away from the robot and into the load lock chamber. The vacuum chuck releases so that there is no more vacuum suction on the platens. The wafer holder 1038 moves up by 0.1 inch in order to pick up all twenty-five wafers from the platens. The twenty-five wafers are transferred into the twenty-five shelves of the first or second compartment of the wafer holder 1038. The centering mechanism 1030–1033 closes to center the wafers and opens again. The twenty-five platens retract back to home position 2009.

Two events happen simultaneously. The wafer holder 1038 moves to the next compartment so that the next compartment's shelves are adjacent to the gate valve 1070 and are ready to receive the next twenty-five wafers from the second cassette stage 1061. Again, this example assumes the operator wants to process fifty wafers in the first load lock chamber. The robot 2000 repeats the above sequence for a second cassette stage 1061 as it retrieves the twenty-five wafers and transfers them to the wafer holder 1038 in the first load lock chamber 1040. During this sequence the transfer chamber 1260 has been under vacuum and the slit valve 1150 has been closed. After the robot 2000 has transferred the twenty-five wafers from the second cassette stage 1061 into the wafer holder 1038 of the first load lock chamber 1040, the gate valve 1070 is closed. Once the gate valve 1070 closes the procedure with regard to the first load lock chamber 1040 is essentially the same as that described above for the system with only one load lock chamber. However, since the configuration in the transfer chamber 1260 for the system with two load lock chambers is different from that in the system with one load lock chamber, the fin index motion is different.

The fin index motion occurs when the wafer is resting on the wafer transfer blade 1360 and a fin 1390. However, in this embodiment, the fin will move up and rotate by about 60 degrees to the first processing stage 1310 and then it will move down until the wafer rests on the first stage 1310. At the same time, the wafer holder 1038 will move up to expose a second wafer on the shelf beneath the top shelf. A second wafer is transferred from the load lock chamber 1040 and into the transfer chamber 1260 while processing of the first wafer occurs. The entire sequence is repeated until there is a wafer on each of the processing stages 1310–1313 within the transfer chamber 1260. All four stages 1310–1313 are connected to ground in one embodiment. In another embodiment, the first processing stage 1310, which is located in a counterclockwise direction from the wafer transfer blade 1360, may be RF biased in order to process a particularly hardened resist known as a "shell" on the wafer surface.

If wafers are being taken from the second load lock chamber 1041, the above procedure will occur five times to load the four processing stages because the first fin movement will have placed the first wafer on the loading and unloading stage 1315 for the first load lock chamber 1040, not on the first processing stage 1310.

Once the first wafer has been processed on each of the stages and is on the fourth processing stage 1313, the fin index motion transfers that first wafer back to the wafer transfer blade 1361 for the second load lock chamber 1041. If the wafer originated from the second load lock chamber 1041, the following describes what happens next; if, on the other hand, the wafer originated from the first load lock chamber 1040, one further fin index motion will take place to bring the wafer back to the wafer transfer blade for the first load lock chamber 1040 before the following occurs. Once the wafer is positioned on the correct wafer transfer blade, the wafer holder in the load lock chamber associated with that wafer transfer blade which wafer holder was positioned with its fifth shelf aligned with the wafer transfer blade moves back so its top shelf where this first wafer originated is aligned with the wafer transfer blade. The wafer transfer blade then extends into the top shelf of the wafer holder. The wafer holder moves up by about 0.1 inch so that the processed wafer is returned to the top shelf. The wafer transfer blade then retracts to home position so that it is inside the transfer chamber. At essentially the same time, the wafer holder then moves to the sixth shelf so that the wafer transfer blade may again extend and extract an unprocessed wafer therefrom which is then transported to the transfer chamber. After the sixth wafer is introduced into the transfer chamber, the system repeats the above transfer sequence, transferring each wafer from stage to stage until each wafer has been processed on all four stages. The above described unloading sequence is repeated six times so that the last six processed wafers are unloaded from the transfer chamber and returned to their original shelves in the wafer holder.

While the above is taking place with regard to wafers from the first load lock chamber 1040, the robot 2000 is moving between the third and fourth cassette stages 1062 and 1063 and the second load lock chamber 1041 in the same manner as described above for the first and second cassette stages 1060 and 1061 and the first load lock chamber 1040, thus loading up to 50 wafers into the second load lock chamber 1041. When the wafers are loaded in to the second load lock chamber 1041, the pressure is lowered in the second load lock chamber 1041 to bring it into equilibrium with that in the transfer chamber 1260. When all of the processed wafers have been returned to the first load lock chamber 1040 and the slit valve 1150 is closed, the slit valve 1151 to the second load lock chamber 1041 opens and the processing of the wafers from the second load lock chamber 1041 proceeds. It will be appreciated that it is not necessary to load each load lock chamber to capacity; i.e., fifty wafers. The system can process any number of wafers up to fifty in each load lock chamber.

In the presently preferred embodiment of the present invention using two load lock chambers, there is no need to turn the RF power off and stop gas flow into the plasma tubes after the wafers in the first load lock chamber have finished dry-strip processing. The wafers from the second load lock chamber are ready for immediate processing.

Once the slit valve 1150 to the first load lock chamber 1040 is shut and the pressure in the chamber is returned to atmospheric, the gate valve 1070 to the first load lock chamber 1040 is opened and another wafer unloading sequence begins. The mechanics are essentially the same as those described above with regard to the embodiment of this invention having one load lock chamber. Once the wafers have been returned to their original wafer cassette stage, 1060 for instance, the robot 2000 immediately proceeds to the next cassette stage holding unprocessed wafers, 1061 for example, and loads them into the just-emptied first load lock chamber 1040. Thus, when the wafers in the second load lock chamber 1041 are through processing, the first load lock chamber 1040 is once again ready to supply wafers to the transfer chamber 1260.

Figure 6A:
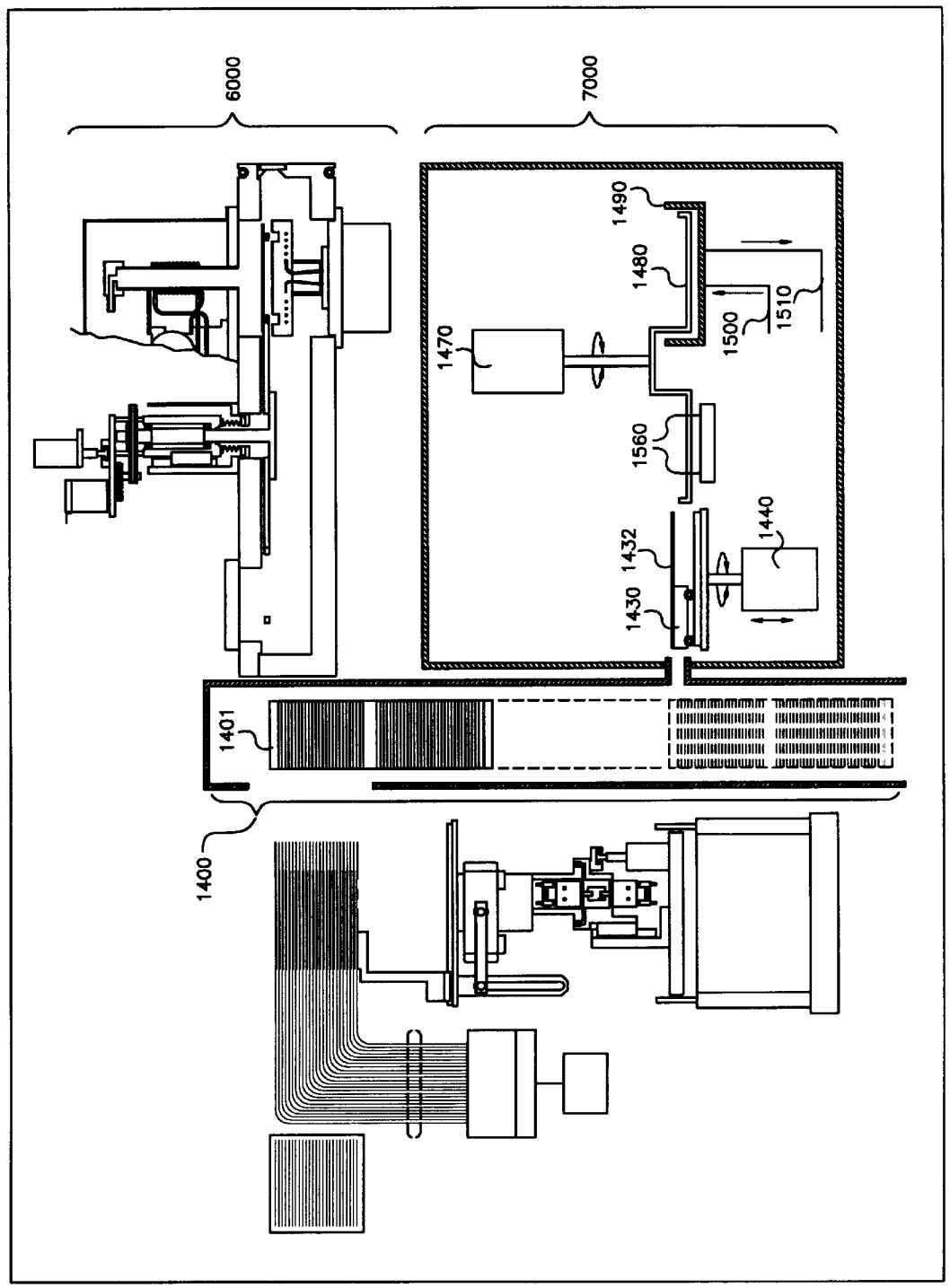
FIG. 6A illustrates a side view of an embodiment of the present invention having a wet-cleaning module located beneath a dry-stripping module with a wafer elevator for moving wafers from one level to the other.

In the presently preferred embodiment of the present invention, wafers processed as above (that is, dry-stripped in the dry-stripping module) are subjected to wet-cleaning before they are returned to the cassette stage. The system for accomplishing this is illustrated in FIG. 6A. The upper module 6000 is the dry-stripping module while the lower module 7000 is the wet processing module. The wet cleaning module is illustrated in FIG. 6B. In this embodiment, twenty-five wafers are initially loaded into each of the two load lock chambers 1040 and 1041 for processing. When the first twenty-five dry-strip processed wafers from the first load lock chamber 1040 are returned to the platens of the robot 2000, rather than return the wafers to the cassette stages 1060–1063, the robot 2000 moves to a wafer elevator car 1401 of a wafer elevator 1400. The wafer elevator car 1401 is of the same design and construction as the wafer holders 1038 and 1039 inside the load lock chambers 1040 and 1041, respectively. Thus, when the robot 2000 platens are extended into the wafer elevator car 1401 and the vacuum chuck turned off, the wafer elevator car 1401 moves up about 0.1 inch lifting the wafers off of the platens. The platens retract and the centering mechanism 1030–1033 closes and centers the wafers. The wafer elevator contains a mechanism 1405 for moving the wafer elevator car 1401 from the level of the dry-stripping module 6000 to the level of the wet-cleaning module 7000.

Once at the level of the wet-cleaning module 7000, the wafer centering mechanism 1030–1033 of the wafer elevator car 1401 retracts and a second robot 1430 extends a single platen into the wafer elevator car 1401 beneath the first wafer. The wafer elevator car 1401 moves up 0.1 inch leaving the wafer resting on the platen. A vacuum chuck 1431 is turned on to hold the wafer in place. The second robot 1430 retracts the platen 1432 and turns toward the loading stage 1560 in the wet-cleaning chamber 8000. The second robot 1430 extends its platen until the wafer is poised about 0.1 inch above the loading stage 1560. The platen moves downward approximately 0.1 inch and the wafer is left resting on the loading stage 1560. The platen 1432 retracts and the second robot 1430 turns toward the wafer elevator car 1401 which moves vertically to bring the next shelf containing a wafer into line with the platen of the second robot 1430 which repeats the preceding procedure to pick up another wafer. In the meantime, the fin index motion 1470 inside the wet-cleaning chamber 8000 moves the wafer from the loading stage 1560 onto the chemical wash stage 1570. Fin construction and operation within the wet-cleaning chamber 8000 is essentially the same as that in the transfer chamber 1260 of the preferred embodiments of this invention as shown in FIGS. 4A and 4B except that, in the wet-cleaning chamber 8000 four fins rather than six or seven are used. The second atmospheric robot 1430 turns toward the wet-cleaning chamber 8000 and extends its platen and deposits another wafer onto the loading stage 1560. When chemical washing is complete at the chemical wash stage 1570, the fin index motion moves the chemically washed wafer to the next stage, the water washing stage 1490 and moves the wafer on the loading stage 1560 to the chemical washing stage 1570. The second robot 1430 places another wafer on the loading stage 1560. When the first wafer to complete the wet-cleaning process, including spin drying on the drying stage 1580, comes around to the loading stage 1560, the second robot 1430 extends its platen, picks up the finished wafer and returns it to the wafer elevator car 1401 which moves so as to bring the shelf from which the wafer was initially taken into line with the platen of the second robot 1430. The platen extends into the wafer elevator car 1401 and about 0.1 inch above the shelf. The wafer elevator car 1401 moves up about 0.1 inch so that the wafer is resting on the shelf. The platen retracts. The wafer elevator car 1401 moves to a position such that the next wafer awaiting wet-cleaning is aligned with the platen of the second robot 1430. The platen extends and extracts another unprocessed wafer from the wafer elevator car 1401 and transports it to the loading stage 1560 as before. The sequence continues until all of the wafers on the wafer elevator car 1401 have been wet-cleaned. When all of the wafers have been returned to the wafer elevator car 1401, the centering mechanism closes on the wafers and the wafer elevator rises to the level of the first robot 2000. The first robot 2000 turns toward the wafer elevator 1400 and extends its twenty-five platens into the wafer elevator car 1401 and about 0.1 inch below the wafers. The wafer elevator car 1401 lowers about 0.1 inch leaving the wafers resting on the platens. The vacuum chuck is turned on to hold the wafers in place and the platens are retracted. The first robot 2000 transports the wafers back to the wafer cassette stage from which they initially were obtained, for example 1060. The robot 2000 extends the twenty-five wafer bearing platens into the wafer cassette stage about 0.1 inch above the wafer shelves in the wafer cassette stage. The platens lower about 0.1 inch and retract leaving the completely processed wafers on the shelves in their original wafer cassette stage. That wafer cassette is removed manually or by means of a third robot and replaced with another cassette of unprocessed wafers. By repeating the preceding steps, wafers can be continuously dry-stripped, wet-cleaned and returned to their original wafer cassettes.

For the purpose of the present invention, the preferred technique for contacting wafers with chemical cleaning agents is by spray heads located above the wet-washing stages. In addition, the preferred mechanism for drying wafers after completion of the wet-washing process and rinsing with water is the well-known process of spin drying.

With regard to the dry-stripping process, a graph of the amount of resist removed or ashed during an actual non-temperature sensitive application of the present invention is illustrated in FIG. 9. Wafer processing stage 1 is set at 160 degrees Celsius (C.) while stages 2–6 are set at 200 C. The cumulative time elapsed is shown on the x-axis below each wafer processing stage. At station 1, 820 angstroms of resist was stripped from the wafer surface. A dramatic increase is seen by the time the wafer leaves stage 2, as a total of 7220 angstroms has now been removed from the wafer surface. At stage 3, a total of 13,600 angstroms of resist has been removed while a total of 20,000 angstroms of resist has been removed by the time the wafer leaves stage 4. A total of fifty-six seconds has elapsed. Overetching or removal of any residual resist occurs at processing stages 5 and 6. Thus, a typical non-temperature sensitive stripping process should take about eighty-four seconds for one wafer. Generally, about 15,000–20,000 angstroms of photoresist is removed per wafer. In a non-temperature sensitive application, the temperature set point for each of the stages may range from room temperature to about 400° C.

Figure 10:
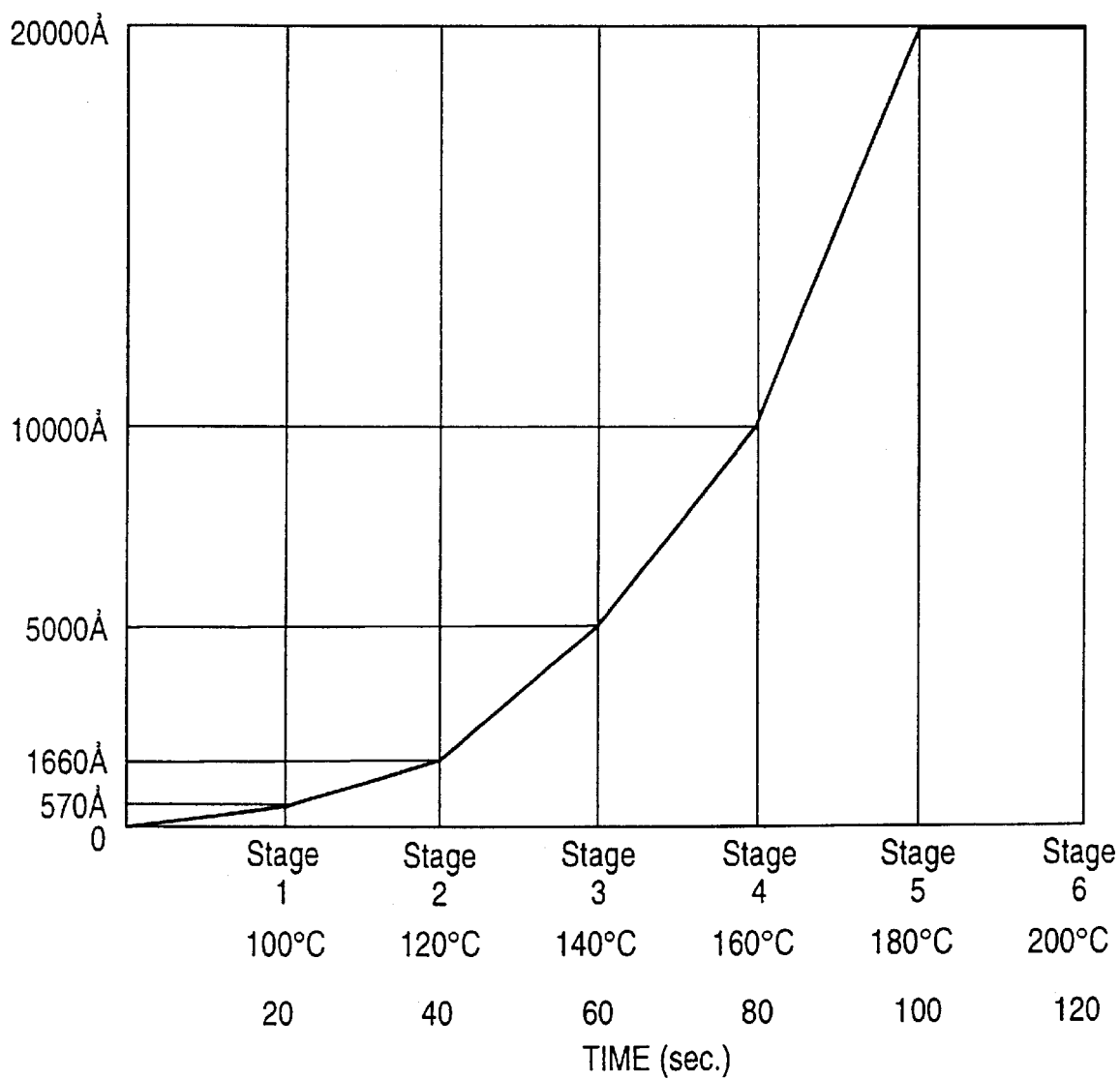

A graph of the etch rate or the amount of resist ashed utilizing a temperature sensitive application of the present invention is illustrated in FIG. 10. The cumulative amount of photoresist etched or ashed per wafer is shown on the Y axis while the cumulative amount of time elapsed in seconds and the temperature of each wafer processing stage is shown on the X axis. Each of the wafer processing stages is set to a different temperature set point to allow a gradual heat-up of the wafer. The first wafer stage is set at 100 C., the second wafer processing stage at 120 C., the third stage at 140 C., and so on in 20 C. increments until a temperature of 200 C. is achieved at processing stage 6. It is to be appreciated that the numbers shown in the graph illustrate only one application of the present invention and that other temperature ranges may be selected depending on the particular application desired.

The slope of the amount etched is not as sharp for a temperature sensitive process as it is for a non-temperature sensitive process because of the gradual heat-up of the wafer. At the end of the wafer's processing time at stage 1, only 570 angstroms of resist was removed as compared to the 820 angstroms removed in the non-temperature sensitive application. The difference is most dramatic at stage 2 where only a total of 1,660 angstroms has been removed by the time the wafer leaves processing stage 2 after forty seconds elapsed. In sharp contrast, a total of 7,220 angstroms was removed after twenty-eight seconds in the non-temperature temperature sensitive application. A total of 3,340 angstroms (5,000 minus 1,660) is removed at processing stage 3 in FIG. 10. After eighty seconds, a cumulative total of 10,000 angstroms is removed at the end of processing stage 4. Finally, the etch is completed at processing stage 5 and the overetch occurs at processing stage 6 after 120 seconds have elapsed. In the typical example, about 15,000 to 20,000 angstroms of resist is ashed or removed per wafer. In another embodiment, the first processing stage is set at 80° C., the second processing stage at 105° C., the third processing stage is set at 130° C., and a fourth processing stage is set at 155° C. while the fifth stage is set at 180° C. and the sixth stage at 210° C.

In the above description, numerous specific details, such as the use of oxygen as a stripping gas, the number of shelves in the wafer holder or the use of a particular temperature set point, are given to be illustrative and not limiting of the present invention. It would still be clear to one skilled in the art that the spirit and scope of the invention may be practiced without these specific details. Moreover, in some instances, well-known semiconductor equipment and processes have not been set forth in detail in order not to unnecessarily obscure the present invention. The apparatus and method of the present invention is defined by the appended claims.

Accordingly, an apparatus and method have been described for stripping the photoresist from a wafer while in a substantially parallel manner, another wafer is being transferred between a load lock chamber and a transfer chamber, where the processing occurs. Further, a system has been described whereby two load lock chambers are employed so that processing of wafers can continue uninterrupted by a delay caused by the need to open, empty, reload and re-equilibrate a single load lock chamber. Still further, a system has been described for performing multi-step dry-stripping applications requiring different conditions for two or more of the steps wherein the steps may be performed simultaneously or sequentially. Finally, a system combining a dry-stripping module and a wet-cleaning module has been described which combination system permits the continuous, fully-automated dry-stripping and wet-cleaning of wafers and, upon completion of the entire processing cycle, returning wafers to their original wafer cassettes. The scope of protection to be afforded by the invention disclosed and described herein are not to be limited except to the extent of the legal scope of the claims appended hereto.

What is claimed:

1. A device for processing a plurality of wafers comprising:

a transfer chamber;

a first load lock chamber coupled to said transfer chamber;

a second load lock chamber coupled to said transfer chamber;

a plurality of cassette stages operatively coupled to both said first and said second load lock chambers, each cassette stage having a plurality of shelves, each shelf being capable of supporting one of said plurality of wafers;

a first wafer holder, having a plurality of shelves, located within said first load lock chamber;

a second wafer holder, having a plurality of shelves, located within said second load lock chamber;

a first robot having a plurality of platens, each of said plurality of platens being capable of supporting one of a plurality of wafers and transferring said wafer between a shelf of said plurality of cassette stages and a shelf of said first or said second wafer holder;

a plurality of stages located within and coupled to said transfer chamber, said stages being disposed at a predetermined radius from a hub concentrically located within and operatively coupled to said transfer chamber, each of said plurality of stages being capable of supporting one of said plurality of wafers during processing;

a first transfer blade located within and operationally coupled to said transfer chamber, said first transfer blade having a retracted and an extended position; in said retracted position, said first transfer blade is located at said predetermined radius, in said extended position said first transfer blade is located in said first load lock chamber, said first transfer blade being capable of transferring a wafer from said first wafer holder to said transfer chamber or from said transfer chamber to said first wafer holder while other wafers are being processed on said plurality of stages within said transfer chamber;

a second transfer blade located within and operationally coupled to said transfer chamber, said second transfer blade having a retracted and an extended position; in said retracted position, said second transfer blade is located at said predetermined radius, in said extended position said second transfer blade is located in said second load lock chamber, said second transfer blade being capable of transferring a wafer from said second wafer holder to said transfer chamber or from said transfer chamber to said second wafer holder while other wafers are being processed on said plurality of stages within said transfer chamber; and, a plurality of fins having a first end and a second end, said first end of each of said fins being coupled to said hub, said second end of each of said fins being located at said predetermined radius and in communication with one of said plurality of stages, said plurality of fins being capable of transferring one of said plurality of wafers from said first or second transfer blade or one of said plurality of stages to another of said plurality of stages or back to said first or second transfer blade;

a plurality of plasma sources coupled to said transfer chamber, each of said plasma sources being located above one of said plurality of stages; and, a plurality of gas inlet tubes, each said gas inlet tube being connected to one of said plurality of plasma sources, the remote end of each of said plurality of gas inlet tubes being connected to a plurality of gas sources, each said gas source being capable of providing a different gas to said plasma source.

2. The device of claim 1 wherein said plurality of cassette stages comprises four cassette stages.

3. The device of claim 1 wherein said stages are independently temperature controlled.

4. A device for processing a plurality of wafers comprising:
   a dry-stripping module, comprising:
      a transfer chamber;
      a first load lock chamber coupled to said transfer chamber;
      a plurality of stages located within and coupled to said transfer chamber, said stages being disposed at a predetermined radius from a hub concentrically located and operatively coupled to said transfer chamber, each of said plurality of stages being capable of supporting one of said plurality of wafers during processing;
      a first transfer blade located within and operationally coupled to said first transfer chamber, said first transfer blade having a retracted and an extended position; in said retracted position, said first transfer blade is located at said predetermined radius, in said extended position said first transfer blade is located in said load lock chamber, said first transfer blade being capable of transferring a wafer from said first wafer holder to said transfer chamber or from said transfer chamber to said first wafer holder while other wafers are being processed on said plurality of stages within said transfer chamber;
      a plurality of fins having a first end and a second end, said first end of each of said fins being coupled to said hub, said second end of each of said fins being located at said predetermined radius and communicating with one of said plurality of stages, said plurality of fins being capable of transferring one of said plurality of wafers from said first transfer blade or one of said plurality of stages to another of said plurality of stages or back to said first transfer blade;
   a wet-cleaning module; and,
   means for transporting said plurality of wafers between said dry-stripping module and said wet-cleaning module.

5. The device of claim 4 wherein said dry-stripping module and said wet-cleaning module are vertically stacked.

6. The device of claim 5 wherein said dry-stripping module is located above said wet-cleaning module.

7. The device of claim 7 wherein said dry-stripping module comprises:
   a first robot operatively coupled to said first load lock chamber, said first robot having a plurality of platens, each of said plurality of platens being capable of supporting one of said plurality of wafers and transferring said wafer to and from said first load lock chamber;
   a first wafer holder having a first plurality of shelves, said first wafer holder being located within said first load lock chamber, each of said plurality of platens of said first robot being capable of picking up a wafer from or depositing a wafer onto one of said first plurality of shelves;
   a plurality of plasma sources coupled to said transfer chamber, each of said plasma sources being located above one of said plurality of stages; and,
   a plurality of gas inlet tubes, each said gas inlet tube being connected to one of said plurality of plasma sources, the remote end of each of said plurality of gas inlet tubes being connected to a plurality of gas sources, each said gas source being capable of providing a different gas to said plasma source.

8. The device of claim 7 wherein each of said plurality of platens is also capable of transferring a wafer between said first load lock chamber and said means for transporting said wafer between said dry-stripping module and said wet-cleaning module.

9. The device of claim 8 comprising:
   a second load lock chamber coupled to said transfer chamber;
   said first robot also being operatively coupled to said second load lock chamber such that each of said plurality of platens is capable of transferring a wafer to and from said second load lock chamber;
   a second wafer holder having a second plurality of shelves, said second wafer holder being located within said second load lock chamber, each of said plurality of platens of said first robot being capable of picking up a wafer from or depositing a wafer onto one of said second plurality of shelves;
   a second transfer blade located within and operationally coupled to said transfer chamber, said second transfer blade having a retracted and an extended position; in said retracted position, said second transfer blade is located at said predetermined radius, in said extended position said second transfer blade is located in said second load lock chamber, said second transfer blade being capable of transferring a wafer from said second wafer holder to said transfer chamber or from said transfer chamber to said second wafer holder while other wafers are being processed on said plurality of stages within said transfer chamber.

10. The device of claim 9 wherein each of said plurality of platens is also capable of transferring a wafer between said second load lock chamber and said means for transporting said wafer between said dry-stripping module and said wet-cleaning module.

11. The device of claim 8 or 10 wherein said wet-cleaning module comprises:

a wet-cleaning chamber;

a second robot coupled to said wet-cleaning chamber;

a plurality of wash stages disposed radially about a common center within said wet cleaning chamber, each of said plurality of wash stages being capable of supporting a wafer during wet-cleaning processing while, at substantially the same time, said second robot is moving another wafer between said wet wash chamber and said means for transporting said wafer between said dry-stripping module and said wet-cleaning module;

a plurality of fins coupled at one end to said common center within said wet-cleaning chamber, the remote end of each said plurality of fins communicating with one of said plurality of wash stages, said plurality of fins being capable of transferring a wafer from one of said plurality of wash stages to another;

means for contacting a wafer with a chemical washing agent;

means for rinsing said wafer; and, means for drying said wafer.

12. The device of claim 11 wherein said means for contacting said wafer with said chemical washing agent comprises:

a single spray head disposed with said wet-wash chamber, said single spray head being located above a first of said plurality of wash stages;

a plurality of chemical washing agent holding vessels coupled to said single spray head.

13. The device of claim 12 wherein said means for rinsing said wafer comprises a plurality of spray heads located above a second of said plurality of wash stages, said plurality of spray heads being coupled to a water holding vessel.

14. The device of claim 13 wherein said means for drying said wafer comprises a third of said plurality of wash stages being capable of spinning about an axis perpendicular to the plane of and central to said wash stage.

15. The device of claim 14 wherein said means of transporting said wafer between said dry-stripping module and said wet-cleaning module comprises a wafer elevator.

16. The device of claim 15 wherein said wafer elevator comprises:

a wafer elevator car; and, a mechanism for moving said wafer elevator car between said dry-stripping module and said wet-cleaning module.

17. The device of claim 4 wherein said stages are independently temperature controlled.

* * * * *